United States Patent
Noda et al.

(10) Patent No.: US 9,653,326 B2
(45) Date of Patent: May 16, 2017

(54) METHOD OF CLEANING, METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Takaaki Noda, Toyama (JP); Masatoshi Takada, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 517 days.

(21) Appl. No.: 14/030,342

(22) Filed: Sep. 18, 2013

(65) Prior Publication Data
US 2014/0087568 A1 Mar. 27, 2014

(30) Foreign Application Priority Data

Sep. 20, 2012 (JP) .................................. 2012-207604

(51) Int. Cl.
*H01L 21/00* (2006.01)
*B08B 7/04* (2006.01)
(Continued)

(52) U.S. Cl.
CPC .......... *H01L 21/67023* (2013.01); *B08B 7/04* (2013.01); *C23C 16/4405* (2013.01);
(Continued)

(58) Field of Classification Search
CPC ........... B08B 7/0035; B08B 6/00; B08B 9/00; H01L 21/02076; H01L 21/02334; H01J 37/32; C23C 16/4405
(Continued)

(56) References Cited

U.S. PATENT DOCUMENTS 5,576,481 A 11/1996 Beardwood
7,709,276 B2 5/2010 Itatani et al.
(Continued)

FOREIGN PATENT DOCUMENTS

JP 6-295907 10/1994
JP 07-331462 A 12/1995
(Continued)

OTHER PUBLICATIONS

Korean Notice of Preliminary Rejection, KR Application No. 10-2013-0109659, Dec. 8, 2015, 7 pages (English ranslation provided).
(Continued)

*Primary Examiner* — Saeed T Chaudhry
(74) *Attorney, Agent, or Firm* — Volpe and Koenig, P.C.

(57) ABSTRACT

A method of cleaning an interior of a process chamber by supplying a cleaning gas into the process chamber after a process of forming a thin film on a substrate in the process chamber is performed, including alternately repeating changing a pressure in the process chamber from a first pressure range to a second pressure range, and changing the pressure in the process chamber from the second pressure range to the first pressure range. In this method, when the pressure in the process chamber is changed to the first pressure range, the pressure in the process chamber is changed to the first pressure range without being maintained at the second pressure range, and when the pressure in the process chamber is changed to the second pressure range, the pressure in the process chamber is changed to the second pressure range without being maintained at the first pressure range.

8 Claims, 15 Drawing Sheets

(51) Int. Cl.
*H01L 21/67* (2006.01)
*H01L 21/02* (2006.01)
*C23C 16/44* (2006.01)
*C23C 16/455* (2006.01)

(52) U.S. Cl.
CPC .... *C23C 16/45557* (2013.01); *H01L 21/0228* (2013.01); *H01L 21/02164* (2013.01); *H01L 21/02211* (2013.01); *H01L 21/02277* (2013.01); *H01L 21/67011* (2013.01)

(58) Field of Classification Search
USPC ..................... 134/1.1, 1.2, 1.3, 42
See application file for complete search history.

(56) References Cited

U.S. PATENT DOCUMENTS

| | | | |
|---|---|---|---|
| 7,967,913 B2* | 6/2011 | Hua | C23C 16/4405 134/1.2 |
| 8,236,692 B2 | 8/2012 | Kato | |
| 8,673,790 B2 | 3/2014 | Akae et al. | |
| 2003/0216041 A1 | 11/2003 | Herring et al. | |
| 2005/0022740 A1 | 2/2005 | Hatano | |

FOREIGN PATENT DOCUMENTS

| | | | |
|---|---|---|---|
| JP | 2005-064465 A | | 3/2005 |
| JP | 2005-524529 A | | 8/2005 |
| JP | 2008-297605 | * | 11/2008 |
| JP | 2008-297605 A | | 12/2008 |
| JP | 2009-272367 A | | 11/2009 |
| JP | 2010-171389 A | | 8/2010 |
| JP | 2012-064970 | | 3/2012 |
| JP | 2012-506637 A | | 3/2012 |
| KR | 10-2002-0046915 A | | 6/2002 |
| KR | 10-2011-0134323 | | 12/2011 |

OTHER PUBLICATIONS

Japanese Notification of Reasons for Refusal, JP Application No. 2012-207604, May 19, 2016, 2 pages (English translation provided).

* cited by examiner

| | FILM FORMING CHARACTERISTICS OF OXIDE FILM | |
|---|---|---|
| | BEFORE CLEANING | AFTER CLEANING |
| TOP PORTION OF BOAT |  |  |
| IN-PLANE AVERAGE FILM THICKNESS | 314.4 Å | 312.3 Å |
| IN-PLANE UNIFORMITY | ±0.65% | ±0.31% |
| MIDDLE PORTION OF BOAT |  |  |
| IN-PLANE AVERAGE FILM THICKNESS | 318.4 Å | 318.4 Å |
| IN-PLANE UNIFORMITY | ±0.37% | ±0.39% |
| BOTTOM PORTION OF BOAT |  |  |
| IN-PLANE AVERAGE FILM THICKNESS | 318.3 Å | 316.8 Å |
| IN-PLANE UNIFORMITY | ±0.77% | ±0.37% |

| NAME | PYRIDINE | AMINOPYRIDINE | PICOLINE | PIPERAZINE | LUTIDINE |
|---|---|---|---|---|---|
| CHEMICAL COMPOSITION FORMULA | $C_5H_5N$ | $C_5H_6N_2$ | $C_6H_7N$ | $C_4H_{10}N_2$ | $C_7H_9N$ |
| CHEMICAL STRUCTURAL FORMULA |  |  |  |  |  |
| ACID DISSOCIATION CONSTANT (pKa) | 5.67 | 6.89 | 6.07 | 5.68 | 6.96 |

METHOD OF CLEANING, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2012-207604, filed on Sep. 20, 2012, the entire content of which is incorporated herein by reference.

TECHNICAL FIELD

The present disclosure relates to a method of cleaning, a method of manufacturing a semiconductor device, a substrate processing apparatus, and a recording medium.

BACKGROUND

A process of manufacturing a semiconductor device may include a process of forming a thin film on a substrate a process chamber at a predetermined temperature and a process of cleaning an interior of the process chamber by supplying a cleaning gas into the process chamber after the process of forming the thin film is performed. This cleaning process may remove deposits including a thin film deposited in the process chamber during the process of forming the thin film on the substrate.

In some cases, during the process of forming the thin film, deposits may be easily deposited on other members that are located out of a processing region in the substrate and at a relatively low temperature within the process chamber. However, it is difficult for a cleaning gas to reach such members located out of the processing region in the substrate. This may result in low cleaning efficiency and incomplete removal of the deposits formed on the members. Repeated substrate processing while the deposits are not completely removed may deteriorate the in-plane uniformity in thickness or in quality of the thin film formed on the substrate.

SUMMARY

The present disclosure provides some embodiments of a method of cleaning, a method of manufacturing a semiconductor device, a substrate processing apparatus, and a recording medium, which are capable of more reliably removing deposits formed in a process chamber and thus improving the in-plane uniformity in thickness or quality of a thin film formed on a substrate.

According to an aspect, there is provided a method of cleaning an interior of a process chamber by supplying a cleaning gas into the process chamber after a process of forming a thin film on a substrate in the process chamber is performed, the method including alternately repeating, in a state where supplying the cleaning gas into the process chamber is maintained, changing a pressure in the process chamber from a first pressure range to a second pressure range and changing the pressure in the process chamber from the second pressure range to the first pressure range, wherein in the act of alternately repeating the acts of changing the pressure in the process chamber, when the pressure in the process chamber is changed to the first pressure range after being changed to the second pressure range, the pressure in the process chamber is changed to the first pressure range without being maintained at the second pressure range, and when the pressure in the process chamber is changed to the second pressure range after being changed to the first pressure range, the pressure in the process chamber is changed to the second pressure range without being maintained at the first pressure range.

According to another aspect, there is provided a method of manufacturing a semiconductor device, the method including performing a process of forming a thin film on a substrate in a process chamber; and cleaning an interior of the process chamber by supplying a cleaning gas into the process chamber after the process of forming the thin film is performed, wherein the act of cleaning the interior of the process chamber includes alternately repeating, in a state where supplying the cleaning gas into the process chamber is maintained, changing a pressure in the process chamber from a first pressure range to a second pressure range and changing the pressure in the process chamber from the second pressure range to the first pressure range, and wherein in the act of alternately repeating the acts of changing the pressure in the process chamber, when the pressure in the process chamber is changed to the first pressure range after being changed to the second pressure range, the pressure in the process chamber is changed to the first pressure range without being maintained at the second pressure range, and when the pressure in the process chamber is changed to the second pressure range after being changed to the first pressure range, the pressure in the process chamber is changed to the second pressure range without being maintained at the first pressure range.

According to still another aspect, there is provided a substrate processing apparatus including a process chamber in which a process of forming a thin film on a substrate is performed; a cleaning gas supply system configured to supply a cleaning gas into the process chamber; a pressure adjuster configured to adjust a pressure in the process chamber; and a controller configured to control the cleaning gas supply system and the pressure adjuster such that when an interior of the process chamber is cleaned by supplying the cleaning gas into the process chamber after the process of forming the thin film on the substrate in the process chamber is performed, changing the pressure in the process chamber from a first pressure range to a second pressure range and changing the pressure in the process chamber from the second pressure range to the first pressure range are alternately repeated in a state where supplying of the cleaning gas into the process chamber is maintained, wherein in the act of alternately repeating the acts of changing the pressure in the process chamber, when the pressure in the process chamber is changed to the first pressure range after being changed to the second pressure range, the pressure in the process chamber is changed to the first pressure range without being maintained at the second pressure range, and when the pressure in the process chamber is changed to the second pressure range after being changed to the first pressure range, the pressure in the process chamber is changed to the second pressure range without being maintained at the first pressure range.

According to yet another aspect, there is provided a non-transitory computer-readable recording medium storing a program that causes a computer to perform a process of cleaning an interior of a process chamber by supplying a cleaning gas into the process chamber after a process of forming a thin film on a substrate in the process chamber is performed, the method including alternately repeating, in a state where supplying the cleaning gas into the process chamber is maintained, changing a pressure in the process chamber from a first pressure range to a second pressure range and changing the pressure in the process chamber from the second pressure range to the first pressure range, wherein in the act of alternately repeating the acts of changing the pressure in the process chamber, when the pressure in the process chamber is changed to the first pressure range after being changed to the second pressure range, the pressure in the process chamber is changed to the first pressure range without being maintained at the second pressure range, and when the pressure in the process chamber is changed to the second pressure range after being changed to the first pressure range, the pressure in the process chamber is changed to the second pressure range without being maintained at the first pressure range.

DETAILED DESCRIPTION

First Embodiment

Figure 1:
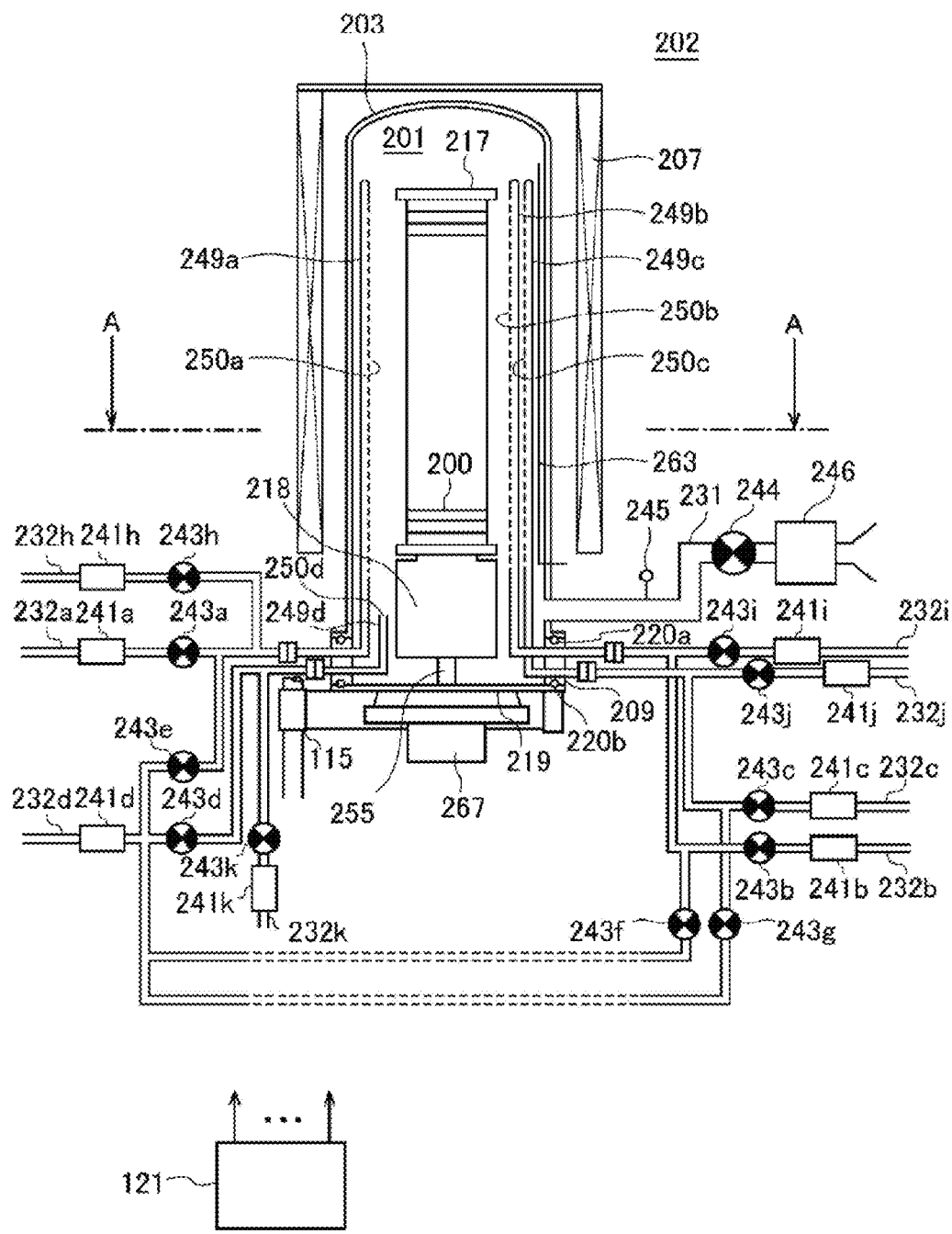
FIG. 1 schematically illustrates a configuration of a vertical process furnace of a substrate processing apparatus, in which a portion of the process furnace is shown by a longitudinal sectional view, according to a first embodiment of the present disclosure.
Figure 2:
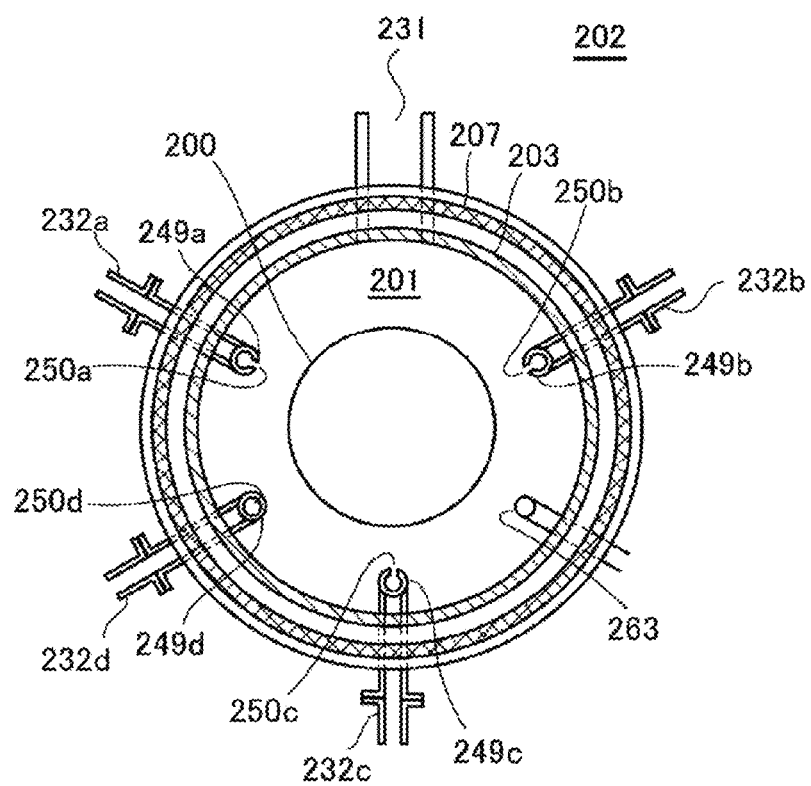
FIG. 2 schematically illustrates a configuration of the vertical process furnace of the substrate processing apparatus, in which a portion of the process furnace is shown by a sectional view taken along a line A-A in FIG. 1, according to the first embodiment of the present disclosure.

Hereinafter, a first embodiment will be described with reference to the drawings.
(1) General Configuration of Substrate Processing Apparatus FIG. 1 schematically illustrates a configuration of a vertical process furnace 202 of a substrate processing apparatus, in which a portion of the process furnace 202 is shown by a longitudinal sectional view, according to a first embodiment of the present disclosure. FIG. 2 schematically illustrates a configuration of the vertical process furnace 202 of the substrate processing apparatus, in which a portion of the process furnace 202 is shown by a sectional view taken along a line A-A in FIG. 1, according to the first embodiment of the present disclosure. The present disclosure is not limited to the substrate processing apparatus of this embodiment but may be properly applied to other substrate processing apparatuses including a process furnace of a single wafer type, a hot wall type, or a cold wall type.

As illustrated in FIG. 1, the vertical process furnace 202 includes a heater 207 serving as a heating unit (heating mechanism). The heater 207 has a cylindrical shape and is supported by a heater base (not shown) serving as a support plate so that the heater 207 is vertically installed. The heater 207 also acts as an activation mechanism to activate gas with heat, as will be described later.

A reaction tube 203 is installed inside the heater 207 in a concentric form along the heater 207. The reaction tube 203 is made of a heat resistant material such as quartz ($SiO_2$), silicon carbide (SiC), or the like and has a cylindrical shape with its upper end closed and its lower end opened. A manifold (inlet flange) 209 is installed below the reaction tube 203, in a concentric form along the reaction tube 203. The manifold 209 is made of metal such as stainless steel or the like and has a cylindrical shape with its upper and lower ends opened. A top portion of the manifold 209 is configured to support the reaction tube 203 in engagement with a bottom portion of the reaction tube 203. Also, an O-ring 220a serving as a seal member is interposed between the manifold 209 and the reaction tube 203. As the manifold 209 is supported to the heater base, the reaction tube 203 remains in a vertically installed posture. A process vessel (reaction vessel) mainly includes the reaction tube 203 and the manifold 209. A process chamber 201 is installed in a hollow portion within the process vessel. The process chamber 201 is configured to accommodate wafers 200. The wafers 200 are horizontally stacked in multiple stages to be aligned in a vertical direction in a boat 217, which will be described later.

In the process chamber 201, a first nozzle 249a, a second nozzle 249b, a third nozzle 249c, and a fourth nozzle 249d are installed to penetrate through a side wall of the manifold 209. The first nozzle 249a, the second nozzle 249b, the third nozzle 249c, and the fourth nozzle 249d are connected to a first gas supply pipe 232a, a second gas supply pipe 232b, a third gas supply pipe 232c, and a fourth gas supply pipe 232d, respectively. The fourth gas supply pipe 232d is branched to each of the first gas supply pipe 232a, the second gas supply pipe 232b, and the third gas supply pipe 232c. As such, the four nozzles 249a, 249b, 249c, and 294d and the four gas supply pipes 232a, 232b, 232c, and 232d are installed to the reaction tube 203 to allow several kinds of (four in this example) gases to be supplied into the process chamber 201.

A mass flow controller (MFC) 241a serving as a flow rate controller (a flow rate control unit) and a valve 243a serving as an opening/closing valve are installed in the first gas supply pipe 232a sequentially from an upstream side. In addition, the fourth gas supply pipe 232d is connected to the first gas supply pipe 232a at a more downstream side of the valve 243a. Further, a first inert gas supply pipe 232h is connected to the first gas supply pipe 232a at more downstream side of a position where the first gas supply pipe 232a is connected with the fourth gas supply pipe 232d. A mass flow controller (MFC) 241h serving as a flow rate controller (a flow rate control unit) and a valve 243h serving as an opening/closing valve are installed in the first inert gas supply pipe 232h sequentially from an upstream side. Furthermore, the above-mentioned first nozzle 249a is connected to a front end of the first gas supply pipe 232a. As shown in FIG. 2, in an arc-shaped space between an inner wall of the reaction tube 203 and the wafers 200, the first nozzle 249a is installed to ascend upward in a direction of stacking the wafers 200 toward an upper portion from a lower portion of the inner wall of the reaction tube 203. Thus, the first nozzle 249a is installed along a wafer arrangement region where the wafers 200 are arranged, in a region that horizontally surrounds the wafer arrangement region at a side of the wafer arrangement region. The first nozzle 249a is configured as an L-shape, and its horizontal portion is installed to penetrate through a side wall of the manifold 209 while its vertical portion is installed to ascend in a direction at least from one end portion to the other portion of the wafer arrangement region. A supply hole 250a for supplying gas is installed at a side surface of the first nozzle 249a. As shown in FIG. 2, the gas supply hole 250a is opened toward a center of the reaction tube 203 to supply the gas to the wafers 200. A plurality of the gas supply holes 250a is installed at a predetermined opening pitch from a lower portion to an upper portion of the reaction tube 203. Each of the gas supply holes 250a may have the same opening area. A first gas supply system mainly includes the first gas supply pipe 232a, the mass flow controller 241a, and the valve 243a. The first gas supply system may also include the first nozzle 249a. In addition, a first inert gas supply system mainly includes the first inert gas supply pipe 232h, the mass flow controller 241h, and the valve 243h. The first inert gas supply system also functions as a purge gas supply system.

A mass flow controller (MFC) 241b serving as a flow rate controller (a flow rate control unit) and a valve 243b serving as an opening/closing valve are installed in the second gas supply pipe 232b sequentially from an upstream side. In addition, the fourth gas supply pipe 232d is connected to the second gas supply pipe 232b at a more downstream side of the valve 243b. Further, a second inert gas supply pipe 232i is connected to the second gas supply pipe 232b at a more downstream side of a position where the second gas supply pipe 232b is connected with the fourth gas supply pipe 232d. A mass flow controller (MFC) 241i serving as a flow rate controller (a flow rate control unit) and a valve 243i serving as an opening/closing valve are installed in the second inert gas supply pipe 232i sequentially from an upstream side. Furthermore, the above-mentioned second nozzle 249b is connected to a front end of the second gas supply pipe 232b. As shown in FIG. 2, in an arc-shaped space between the inner wall of the reaction tube 203 and the wafers 200, the second nozzle 249b is installed to ascend upward in the direction of stacking the wafers 200 toward an upper portion from a lower portion of the inner wall of the reaction tube 203. Thus, the second nozzle 249b is installed along the wafer arrangement region where the wafers 200 are arranged, in a region that horizontally surrounds the wafer arrangement region at a side of the wafer arrangement region. The second nozzle 249b is configured as an L-shape, and has its horizontal portion is installed to penetrate through a side wall of the manifold 209 while its vertical portion is installed to ascend in a direction at least from one end portion to the other end portion of the wafer arrangement region. A gas supply holes 250b for supplying gas is installed at a side surface of the second nozzle 249b. As shown in FIG. 2, the gas supply hole 250b is opened toward the center of the reaction tube 203 to supply the gas to the wafer 200. A plurality of the gas supply holes 250b is installed at a predetermined opening pitch from a lower portion to an upper portion of the reaction tube 203. Each of the gas supply holes 250b may have the same opening area. A second gas supply system mainly includes the second gas supply pipe 232b, the mass flow controller 241b, and the valve 243b. The second gas supply system may also include the second nozzle 249b. In addition, a second inert gas supply system mainly includes the second inert gas supply pipe 232i, the mass flow controller 241i, and the valve 243i. The second inert gas supply system also functions as a purge gas supply system.

A mass flow controller (MFC) 241c serving as a flow rate controller (a flow rate control unit) and a valve 243c serving as an opening/closing valve are installed in the third gas supply pipe 232c sequentially from an upstream side. In addition, the fourth gas supply pipe 232d is connected to the third gas supply pipe 232c at a more downstream side of the valve 243c. Further, a third inert gas supply pipe 232j is connected to the third gas supply pipe 232c at a more downstream side of a position where the third gas supply pipe 232c is connected with the fourth gas supply pipe 232d. A mass flow controller 241j serving as a flow rate controller (a flow rate control unit) and a valve 243j serving as an opening/closing valve are installed in the third inert gas supply pipe 232j sequentially from an upstream side. Furthermore, the above-mentioned third nozzle 249c is connected to a front end of the third gas supply pipe 232c. As shown in FIG. 2, in an arc-shaped space between the inner wall of the reaction tube 203 and the wafers 200, the third nozzle 249c is installed to ascend upward in the direction of stacking the wafers 200 toward an upper portion from a lower portion of the inner wall of the reaction tube 203. Thus, the second nozzle 249b is installed along the wafer arrangement region where the wafers 200 are arranged, in a region that horizontally surrounds the wafer arrangement region at a side of the wafer arrangement region. The third nozzle 249c is configured as an L-shape, and its horizontal portion is installed to penetrate through a side wall of the manifold 209 while its vertical portion is installed to ascend in a direction at least from one end portion to the other end portion of the wafer arrangement region. A gas supply hole 250c for supplying gas is installed at a side surface of the third nozzle 249c. As shown in FIG. 2, the gas supply hole 250c is opened toward the center of the reaction tube 203 to supply the gas to the wafer 200. A plurality of the gas supply holes 250c is installed at a predetermined opening pitch from a lower portion to an upper portion of the reaction tube 203. Each of the gas supply holes 250c may have the same opening area. A third gas supply system mainly includes the third gas supply pipe 232c, the mass flow controller 241b, and the valve 243c. The third gas supply system may also include the third nozzle 249c. In addition, a third inert gas supply system mainly includes the third inert gas supply pipe 232j, the mass flow controller 241j, and the valve 243j. The third inert gas supply system also functions as a purge gas supply system.

As described above, the gas supply systems according to the embodiment transfer gas via the nozzles 249a, 249b, and 249c arranged in the circular arc-shaped longitudinal space defined by the inner wall of the reaction tube 203 and end portions of the plurality of loaded wafers 200, and supplies the gases from the gas supply holes 250a, 250b, and 250c (which are opened in the nozzles 249a, 249b, and 249c, respectively) into the reaction tube 203, near the wafers 200. Accordingly, the gas supplied into the reaction tube 203 mainly flows within the reaction tube 203 in a direction parallel to surfaces of the wafers 200, i.e., in a horizontal direction. According to such a configuration, the gas can be uniformly supplied to the wafers 200, thereby making a film thickness of a thin film formed in each of the wafers 200 uniform. Further, gas flowing on the surfaces of the wafers 200 after reaction, i.e., residual gas, flows toward a side of an exhaust port, i.e., an exhaust pipe 231 which will be described below. However, the flow direction of the residual gas may be appropriately specified depending on a position of the exhaust port, and is not limited to a vertical direction.

A mass flow controller (MFC) 241d serving as a flow rate controller (a flow rate control unit) is installed in the fourth gas supply pipe 232d. In addition, the fourth gas supply pipe 232d is branched into four supply pipes at a more downstream side of the mass flow controller (MFC) 241d, and valves 243d, 243e, 243f, and 243g are installed in the branch supply pipes, respectively. A fourth inert gas supply pipe 232k is connected to the fourth gas supply pipe 232d at a more downstream side of the valve 243d. A mass flow controller 241k serving as a flow rate controller (a flow rate control unit) and a valve 243k serving as an opening/closing valve are installed in the fourth inert gas supply pipe 232k sequentially from an upstream side. In addition, the above-mentioned fourth nozzle 249d is connected to a front end of the fourth gas supply pipe 232d.

In addition, downstream portions of the fourth gas supply pipe 232d, where the valves 243e, 243f, and 243g are installed, respectively, are connected between the valve 243a of the first gas supply pipe 232a and the first inert gas supply pipe 232h, between the valve 243b of the second gas supply pipe 232b and the second inert gas supply pipe 232i, and between the valve 243c of the third gas supply pipe 232c and the third inert gas supply pipe 232j, respectively. Accordingly, these branches of the fourth gas supply pipe 232d are connected to the nozzles 249a, 249b, and 249c via the gas supply pipes 232a, 232b, and 232c, respectively.

As shown in FIG. 2, in an arc-shaped space between a lower portion of the inner wall of the reaction tube 203 and a side of a base portion of the boat 217 that supports the wafers 200 (i.e., a heat insulating member 218 which will be described later), the fourth nozzle 249d is installed to ascend upward in the direction of stacking the wafers 200 from a lower portion of the inner wall of the reaction tube 203. Thus, the fourth nozzle 249d is installed along the side of the base portion of the boat 217, in a region that horizontally surrounds the base portion of the boat 217 at a lower side of the wafer arrangement region where the wafers 200 are arranged. The fourth nozzle 249d is configured as an L-shape, and its horizontal portion is installed to penetrate through a side wall of the manifold 209 while its vertical portion is installed to ascend in a direction at least from the base portion of the boat 217 to a lower end portion of the wafer arrangement region. A gas supply hole 250d for supplying gas is installed at a side surface of the fourth nozzle 249d. As shown in FIG. 2, the gas supply hole 250d is opened toward an upper side of the reaction tube 203 to supply the gas to the wafer arrangement region in the process chamber 201. A fourth gas supply system mainly includes the fourth gas supply pipe 232d, the mass flow controller 241d, and the valves 243d, 243e, 243f, and 243g. The fourth gas supply system may also include the fourth nozzle 249d. The fourth gas supply system may also include the first nozzle 249a, the second nozzle 249b, and the third nozzle 249c which are connected with the branch portions of the fourth gas supply pipe 232d via the first gas supply pipe 232a, the second gas supply pipe 232b, and the third gas supply pipe 232c, respectively. In addition, a fourth inert gas supply system mainly includes the fourth inert gas supply pipe 232k, the mass flow controller 241k, and the valve 243k. The fourth inert gas supply system also functions as a purge gas supply system.

A precursor gas including a certain element and a halogen group, for example, a chlorosilane-based precursor gas including at least a silicon (Si) element and a chloro group, is supplied from the first gas supply pipe 232a into the process chamber 201 via the mass flow controller 241a, the valve 243a, and the first nozzle 249a. As used herein, a chlorosilane-based precursor gas refers to a gas obtained by vaporizing a chlorosilane-based precursor that is in a liquid state under normal temperature and pressure. Also, a chlorosilane-based precursor refers to a silane-based precursor including a chloro group having at least silicon (Si) and chlorine (Cl). In addition, as used herein, the term "precursor" may denote "a liquid precursor in a liquid state," "a gaseous precursor produced by vaporizing a liquid precursor," or both of them. Therefore, in the present disclosure, the term "chlorosilane-based precursor" may denote "a liquid chlorosilane-based precursor," "a gaseous chlorosilane-based precursor," or both of them. An example of a gaseous chlorosilane-based precursor may include hexachlorodisilane ($Si_2Cl_6$, abbreviated to HCDS) gas. In the case of employing a liquid precursor such as HCDS which is in a liquid state under normal temperature and pressure, the liquid precursor (e.g., HCDS) may be vaporized by a vaporizing system such as a vaporizer or a bubbler to be supplied as a gaseous precursor (e.g., HCDS gas).

A gas including oxygen (O) (i.e., an oxygen-containing gas), i.e., an oxidation gas, serving as an oxidation agent, is supplied from the second gas supply pipe 232b into the process chamber 201 via the mass flow controller 241b, the valve 243b, and the second nozzle 249b. An example of the oxidation agent, may include vapor ($H_2O$ gas) which may be generated by mixing oxygen ($O_2$) gas and hydrogen ($H_2$) gas supplied into an external combustion apparatus (not shown).

A gas including nitrogen (N) having an electron lone pair (i.e., a nitrogen-based gas) serving as a catalyst having an acid dissociation constant (pKa) of 5 to 11, specifically, for example, 5 to 7, i.e., a catalyst gas which weakens an O—H bonding force in a surface of the wafer 200 or in $H_2O$ to promote HCDS gas dissociation and oxidation reaction by $H_2O$ gas by using catalytic action, is supplied from the third gas supply pipe 232c into the process chamber 201 via the mass flow controller 241c, the valve 243c, and the third nozzle 249c. An example of the catalyst may include pyridine ($C_5H_5N$) gas.

A gas including fluorine (F) (i.e., a fluorine-containing gas) serving as a cleaning gas, i.e., a fluorine-based gas, is supplied from the fourth gas supply pipe 232d into the process chamber 201 via the mass flow controller 241d, the valve 243d, and the fourth nozzle 249d. The fluorine-based gas is supplied from the branch portions of the fourth gas supply pipe 232d into the process chamber 201 via the individual valves 243e, 243f, and 243g, the individual gas supply pipes 232a, 232b, and 232c, and the individual nozzles 249a, 249b, and 249c. An example of the cleaning gas may include hydrogen fluoride (HF) gas.

Nitrogen ($N_2$) gas is supplied from the inert gas supply pipes 232h, 232i, 232j, and 232k into the process chamber 201 via the individual mass flow controllers 241h, 241i, 241j, and 241k, the individual valves 243h, 243i, 243j, and 243k, the individual gas supply pipes 232a, 232b, 232c, and 232d, and the individual nozzles 249a, 249b, 249c, and 249d.

For example, when the above-mentioned gases are flown from the individual gas supply pipes, a chlorosilane-based precursor gas supply system serving as a precursor supply system for supplying a precursor including a certain element and a halogen group, i.e., a precursor gas supply system (a silicon precursor gas supply system), is constituted by the first gas supply system. An oxidation agent supply system for supplying an oxidation agent, i.e., an oxidation gas supply system (an oxygen-containing gas supply system), is constituted by the second gas supply system. A catalyst supply system for supplying a catalyst, i.e., a catalyst gas supply system, is constituted by the third gas supply system. A cleaning gas supply system for supplying a cleaning gas, i.e., a fluorine-based gas supply system (a fluorine-containing gas supply system), is constituted by the fourth gas supply system.

The exhaust pipe 231 for exhausting an internal atmosphere of the process chamber 201 is installed at the reaction tube 203. The exhaust pipe 231 is equipped with a pressure sensor 245 (pressure detecting unit) for detecting a pressure in the process chamber 201, an APC (Auto Pressure Controller) valve 244 serving as a pressure adjuster (pressure adjusting unit), and a vacuum pump 246 serving as a vacuum exhaust device. The APC valve 244 is configured to perform/stop vacuum-exhaust in the process chamber 201 by opening/closing the valve with the actuated vacuum pump 246, and further to adjust the pressure in the process chamber 201 by adjusting a degree of the valve opening with the actuated vacuum pump 246. An exhaust system mainly includes the exhaust pipe 231, the APC valve 244, and the pressure sensor 245. The exhaust system may also include the vacuum pump 246. The exhaust system is configured to adjust the degree of the valve opening of the APC valve 244 based on pressure information detected by the pressure sensor 245 while operating the vacuum pump 246 such that the pressure in the process chamber 201 is vacuum-exhausted to a predetermined pressure (a vacuum level). The exhaust pipe 231 may be installed in the manifold 209, similar to the nozzles 249a, 249b, 249c, and 249d, without being limited to the reaction tube 203.

A seal cap 219, which functions as a furnace port cover configured to hermetically seal a lower end opening of the manifold 209, is installed under the manifold 209. The seal cap 219 is configured to contact the lower end portion of the manifold 209 from the below in a vertical direction. The seal cap 219, for example, may be formed of metal such as stainless steel and have a disc shape. An O-ring 220b is installed at an upper surface of the seal cap 219 to be configured as a seal member in contact with the lower end portion of the manifold 209. A rotation mechanism 267 configured to rotate the boat 217, which is a substrate holder to be described later, is installed below the seal cap 219. A rotary shaft 255 of the rotation mechanism 267 is connected to the boat 217 through the seal cap 219. The rotation mechanism 267 is configured to rotate the wafers 200 by rotating the boat 217. The seal cap 219 is configured to be vertically elevated or lowered by a boat elevator 115, which is an elevation mechanism vertically installed from outside the reaction tube 203. The boat elevator 115 is configured to enable the boat 217 to be loaded into or unloaded from the process chamber 201 by elevating or lowering the seal cap 219. As such, the boat elevator 115 is configured as a transfer device (transfer mechanism) that transfers the boat 217 and the wafers 200 held by the boat 217 into and out of the process chamber 201.

The boat 217 serving as a substrate support is made of, for example, a heat resistant material such as quartz, silicon carbide, or the like, and is configured to support the wafers 200 horizontally stacked in multiple stages with the center of the wafers 200 concentrically aligned. In addition, a heat insulating member 218 made of, for example, a heat resistant material such as quartz, silicon carbide, or the like is installed below the boat 217, and is configured to make it difficult for heat from the heater 207 to be transferred to the seal cap 219. The heat insulating member 218 may include a plurality of heat insulating plates, each of which is made of a heat resistant material such as quartz, silicon carbide, or the like, and a heat insulating plate holder configured to support these heat insulating plates horizontally in multiple stages.

A temperature sensor 263 serving as a temperature detector is installed within the reaction tube 203. Based on temperature information detected by the temperature sensor 263, an electric conduction state of the heater 207 is adjusted such that an interior of the process chamber 201 has a desired temperature distribution. The temperature sensor 263 has an L-shape similar to the nozzles 249a, 249b, and 249c and is installed along the inner wall of the reaction tube 203.

Figure 3:
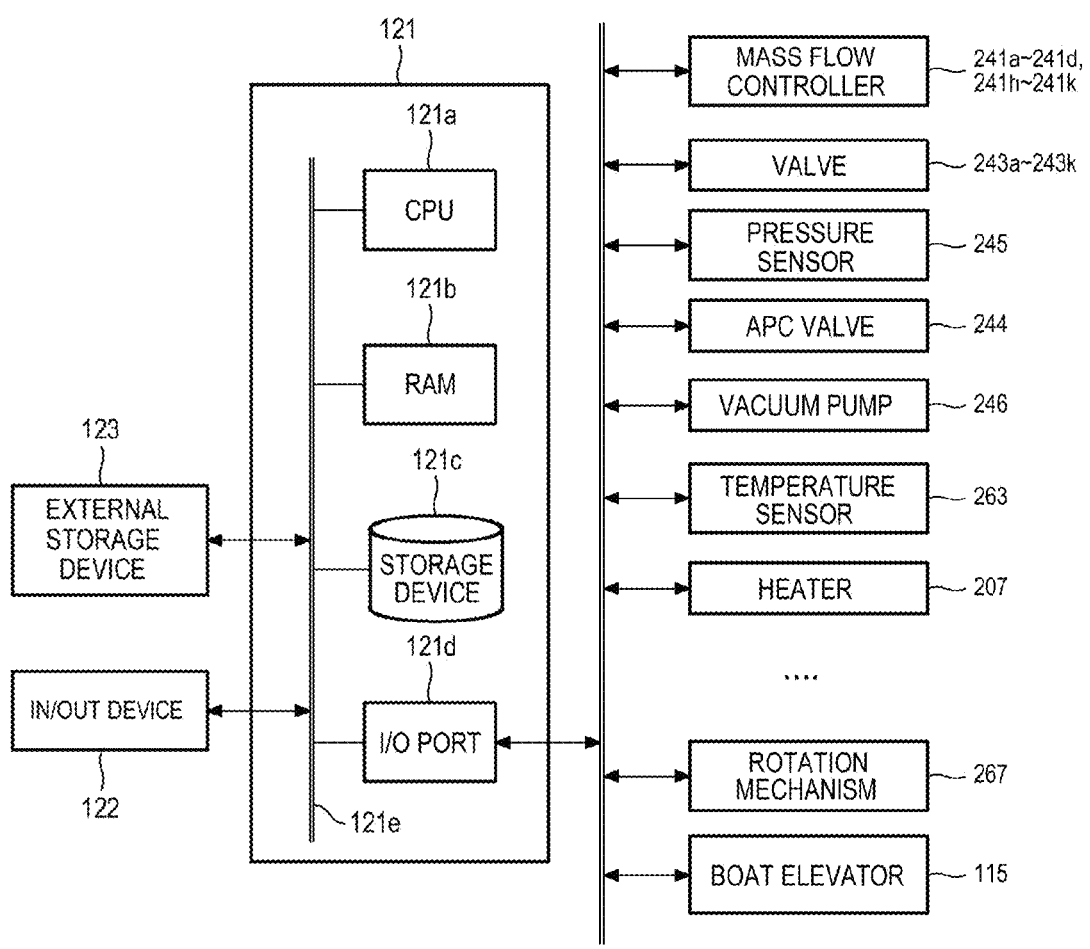
FIG. 3 schematically illustrates a configuration of a controller of the substrate processing apparatus, according to the first embodiment of the present disclosure.

As shown in FIG. 3, a controller 121, which is a control unit (control part), may be configured as a computer including a CPU (Central Processing Unit) 121a, a RAM (Random Access Memory) 121b, a memory device 121c, and an I/O port 121d. The RAM 121b, the memory device 121c, and the I/O port 121d are configured to exchange data with the CPU 121a via an internal bus 121e. An in/out device 122, for example, including a touch panel or the like, is connected to the controller 121.

The memory device 121c may be configured by, for example, a flash memory, a HDD (Hard Disk Drive), or the like. A control program for controlling an operation of the substrate processing apparatus, a process recipe describing sequences and conditions of substrate processing such as thin film forming, which will be described later, and a cleaning recipe describing sequences and conditions of cleaning processing, which will be described later, are readably stored in the memory device 121c. The process recipe functions as a program to cause the controller 121 to execute procedures in substrate processing such as thin film forming, which will be described later, in combination to obtain a desired result. The cleaning recipe functions as a program to cause the controller 121 to execute procedures in cleaning processing, which will be described later, in combination to obtain a desired result. Hereinafter, the process recipe, cleaning recipe, and control program are collectively simply referred to as a program. Also, when the term "program" is used herein, it may indicate a case of including only a process recipe, a case of including only a cleaning recipe, a case of including only a control program, or a case of including any combinations thereof. In addition, the RAM 121b is configured as a memory area (work area) in which a program or data read by the CPU 121a is temporarily stored.

The I/O port 121d is connected to the mass flow controllers 241a, 241b, 241c, 241d, 241h, 241i, 241j, and 241k, the valves 243a, 243b, 243c, 243d, 243e, 243f, 243g, 243h, 243i, 243j, and 243k, the pressure sensor 245, the APC valve 244, the vacuum pump 246, the heater 207, the temperature sensor 263, the rotation mechanism 267, the boat elevator 115 and so on.

The CPU 121a is configured to read and execute a control program from the memory device 121c and read a process recipe or a cleaning recipe from the memory device 121c according to an operation command input from the in/out device 122. The CPU 121a is further configured to control a flow rate adjustment operation of various gases by the mass flow controllers 241a, 241b, 241c, 241d, 241h, 241i, 241j, and 241k, an opening/closing operation of the valves 243a, 243b, 243c, 243d, 243e, 243f, 243g, 243h, 243i, 243j, and 243k, an opening/closing operation of the APC valve 244, a pressure adjustment operation by the APC valve 244 based on the pressure sensor 245, an operation of starting and stopping the vacuum pump 246, a temperature adjusting operation of the heater 207 based on the temperature sensor 263, rotation and a rotation speed adjustment operation of the boat 217 by the rotation mechanism 267, an elevation operation by the boat elevator 115, etc., according to contents of the read process recipe.

Moreover, the controller 121 may be configured as a general-purpose computer without being limited to a dedicated computer. For example, in one embodiment, the controller 121 may be configured by preparing an external storage device 123 (for example, a magnetic tape, a magnetic disk such as a flexible disk or a hard disk, an optical disk such as CD or DVD, a magneto-optical disk such as MO, and a semiconductor memory such as a USB memory or a memory card), which stores the above-described program, and installing the program on the general-purpose computer from the external storage device 123. Also, means for providing a program to a computer is not limited to the case where the program is provided through the external storage device 123. For example, the program may be provided using communication means such as the Internet, a dedicated line or the like, without the external storage device 123. Further, the memory device 121c or the external storage device 123 is configured as a non-transitory computer-readable recording medium. Hereinafter, the means for providing the program will be simply referred to as a "recording medium." In addition, when the term "recording medium" is used herein, it may include a case of including only the memory device 121c, a case of including only the external storage device 123, or a case of including both the memory device 121c and the external storage device 123.

(2) Thin Film Forming Process

As one of the processes of manufacturing a semiconductor device using the process furnace 202 of the above-described substrate processing apparatus, a process of forming a thin film on a substrate in the process chamber 201 and a process of cleaning an interior of the process chamber will be now described.

Figure 4:
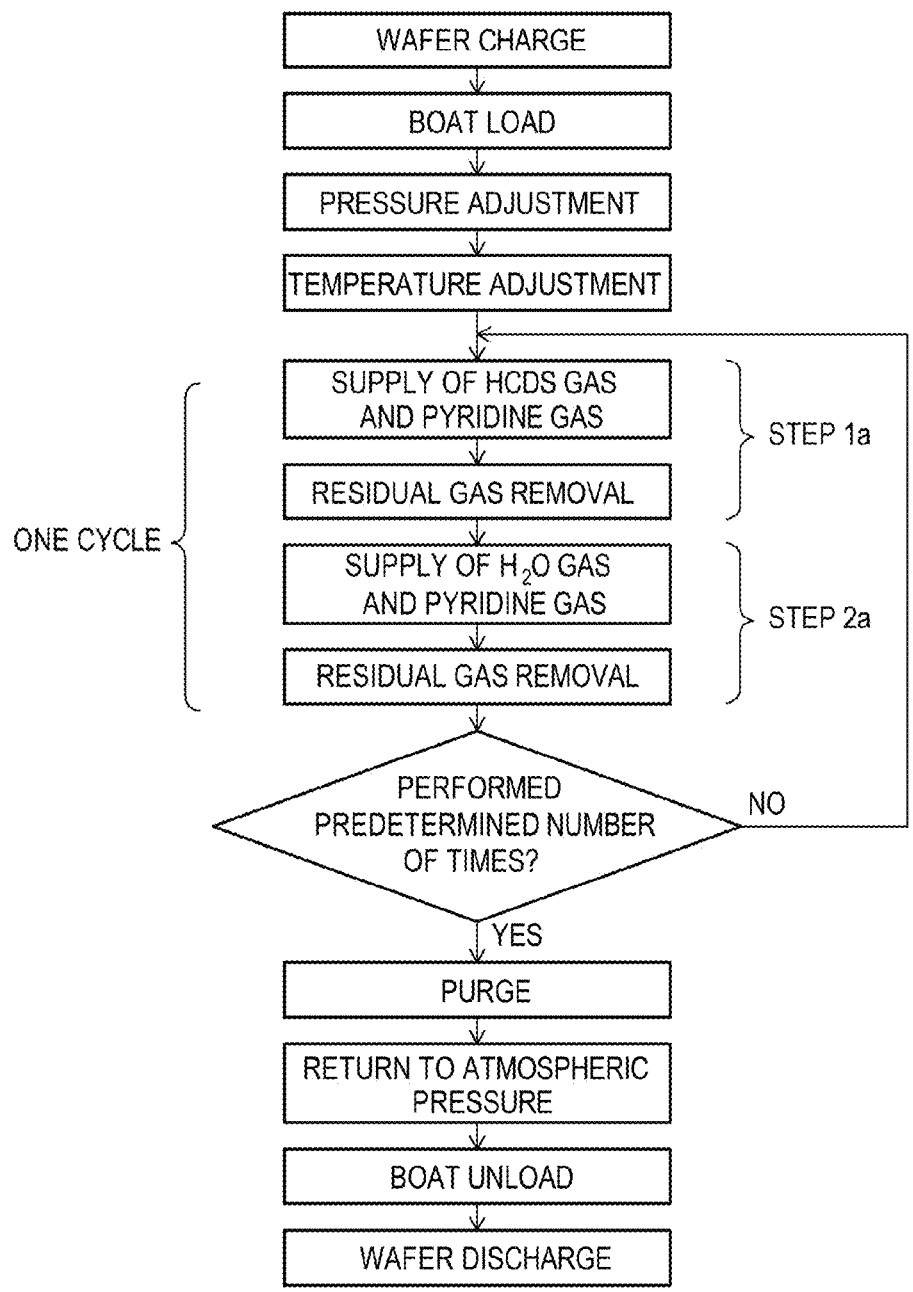
FIG. 4 depicts a flowchart for forming a film in a film forming sequence according to the first embodiment of the present disclosure.
Figure 5:
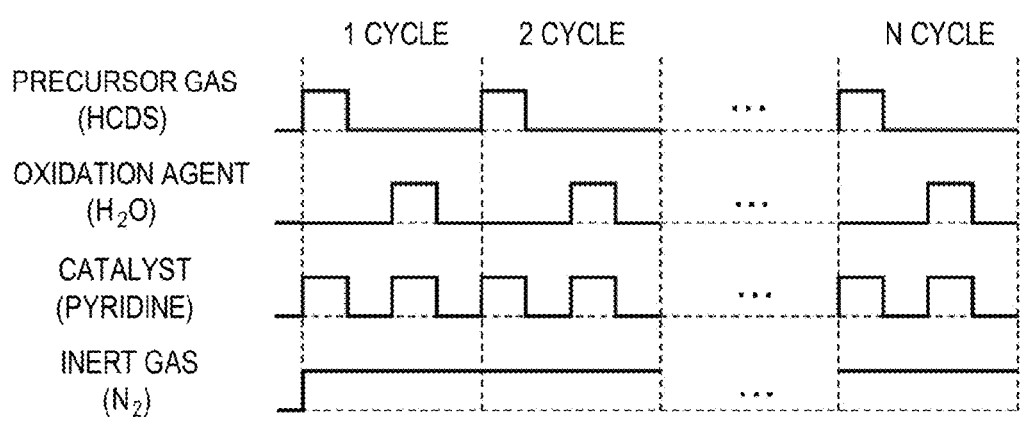
FIG. 5 depicts a timing diagram for supplying a plurality of gases in the film forming sequence according to the first embodiment of the present disclosure.

First, a sequence of forming a thin film on a substrate will be described with reference to FIGS. 4 and 5. FIG. 4 depicts a flowchart for forming a film in a film forming sequence according to the first embodiment of the present disclosure. FIG. 5 depicts a timing diagram for supplying a plurality of gases in the film forming sequence according to the first embodiment of the present disclosure. In the following description, the controller 121 controls operations of various units constituting the substrate processing apparatus.

In this embodiment, supply conditions of a plurality of kinds of gases including a plurality of elements constituting a thin film to be formed are controlled such that the thin film to be formed has a stoichiometric composition ratio or a composition ratio different from the stoichiometric composition ratio. For example, the supply conditions are controlled such that at least one of the plurality of elements constituting the thin film to be formed is in excess of other elements in terms of a stoichiometric composition. An example of a film forming sequence while controlling a film composition ratio which represents a ratio between a plurality of elements constituting the film will be described later.

Hereinafter, an example of forming an oxide film serving as a thin film on the substrate will be described. In addition, an example of using a precursor gas, an oxidation agent, and a catalyst to form the oxide film while a substrate temperature is set to a temperature range from room temperature to 100 degrees C. will be described.

In the thin film forming sequence of this embodiment, an oxide film is formed as a thin film on a substrate by performing a cycle multiple times, the cycle including a process of supplying a precursor gas to the substrate, a process of supplying an oxidation agent to the substrate, and a process of supplying a catalyst to the substrate.

A silicon oxide film (SiO film) may be formed as a thin film by alternately performing a cycle multiple times, the cycle including a process of forming a silicon-containing layer as a first layer on a wafer 200 in a process chamber 201 by supplying HCDS gas serving as a precursor gas and pyridine gas serving as a catalyst to the wafer 100 and a process of forming a silicon oxide layer (SiO layer) as a second a layer on the wafer 200 in the process chamber 201 by modifying the first layer by supplying $H_2O$ gas serving as an oxidation agent and pyridine gas serving as a catalyst to the wafer 200.

The phrase "performing a cycle multiple times, the cycle including individual process" include the case of performing the cycle once and the case of repeating the cycle multiple times. This means that this cycle is performed one or more times (i.e., a predetermined number of times). The phrase "the cycle including a process of supplying a precursor gas, a process of supplying an oxidation agent, and a process of supplying a catalyst" means that the cycle may include any number of each process in any order. In this case, two or more processes may be performed simultaneously.

The phrase "alternately performing a predetermined number of times a process of supplying a precursor gas and a catalyst and a process of supplying an oxidation agent and a catalyst" means alternately performing one or more times a process of supplying one of the precursor gas and the oxidation agent and a process of supplying the other of them while supplying the catalyst during both of the processes.

This means alternately performing each process one or more times. For example, each process may be alternately repeated multiple times.

Moreover, when the term "wafer" is used herein, it may refer to "the wafer itself" or "the wafer and a laminated body (a collected body) of predetermined layers or films formed on the surface of the wafer" (i.e., the wafer including the predetermined layers or films formed on the surface may be referred to as a wafer). In addition, the phrase "a surface of a wafer" as used herein may refer to "a surface (an exposed surface) of a wafer itself" or "a surface of a predetermined layer or film formed on the wafer, i.e., the uppermost surface of the wafer which is a laminated body."

Accordingly, the phrase "a predetermined gas is supplied to a wafer" may mean that "a predetermined gas is directly supplied to a surface (an exposed surface) of a wafer itself" or that "a predetermined gas is supplied to a layer or a film formed on a wafer, i.e., on the uppermost surface of a wafer as a laminated body." Also, the phrase "a predetermined layer (or film) is formed on a wafer" may mean that "a predetermined layer (or film) is directly formed on a surface (an exposed surface) of a wafer itself" or that "a predetermined layer (or film) is formed on a layer or a film formed on a wafer, i.e., on the uppermost surface of a wafer as a laminated body."

Moreover, the term "substrate" as used herein may be synonymous with the term "wafer," and in this case, the terms "wafer" and "substrate" may be used interchangeably in the above description.

(Wafer Charging and Boat Loading)

When the plurality of wafers 200 are charged on the boat 217 (wafer charging), as illustrated in FIG. 1, the boat 217 supporting the plurality of wafers 200 is raised by the boat elevator 115 to be loaded into the process chamber 201 (boat loading). In this state, the seal cap 219 seals the lower end portion of the reaction tube 203 via the O-ring 220b.

(Pressure Adjustment and Temperature Adjustment)

The interior of the process chamber 201 is vacuum-exhausted by the vacuum pump 246 to set the interior to a desired pressure (vacuum level). Here, the pressure in the process chamber 201 is measured by the pressure sensor 245 and the APC valve 244 is feedback-controlled based on the measured pressure information (pressure adjustment). Also, the vacuum pump 246 maintains a regular operation state at least until processing on the wafers 200 is terminated. The interior of the process chamber 201 is heated by the heater 207 to set the interior to a desired temperature. In this case, the electric conduction state to the heater 207 is feedback-controlled based on the temperature information detected by the temperature sensor 263 such that the interior of the process chamber 201 has a desired temperature distribution (temperature adjustment). Heating of the interior of the process chamber 201 by the heater 207 continues at least until processing on the wafers 200 is terminated. However, if processing on the wafers 200 is performed at room temperature, heating in the process chamber 201 by the heater 207 may not be performed. Subsequently, the boat 217 and the wafers 200 begin to be rotated by the rotation mechanism 267. The rotation of the boat 217 and the wafers 200 by the rotation mechanism 267 continues at least until processing on the wafers 200 is terminated.

(Process of Forming Silicon Oxide Film)

Thereafter, the following two steps (Steps 1a and 2a) are sequentially performed.

[Step 1a]

(Supply of HCDS Gas and Pyridine Gas)

The valve 243a of the first gas supply pipe 232a is opened to flow HCDS gas into the first gas supply pipe 232a. A flow rate of the HCDS gas flowing into the first gas supply pipe 232a is adjusted by the mass flow controller 241a. The flow rate-adjusted HCDS gas is supplied from the gas supply holes 250a of the first nozzle 249a into the process chamber 201 and is exhausted through the exhaust pipe 231. In this way, the HCDS gas is supplied to the wafers 200 (HCDS gas supply). At the same time, the valve 243h is opened to flow an inert gas such as $N_2$ gas or the like into the first inert gas supply pipe 232h. A flow rate of the $N_2$ gas flowing into the first inert gas supply pipe 232h is adjusted by the mass flow controller 241h. The flow rate-adjusted $N_2$ gas is supplied into the process chamber 201, along with the HCDS gas, and is exhausted through the exhaust pipe 231.

In this case, the valve 243c of the third gas supply pipe 232c is opened to flow pyridine gas into the third gas supply pipe 232c. A flow rate of the pyridine gas flowing into the third gas supply pipe 232c is adjusted by the mass flow controller 241c. The flow rate-adjusted pyridine gas is supplied from the gas supply holes 250c of the third nozzle 249c into the process chamber 201 and is exhausted through the exhaust pipe 231. In this way, the pyridine gas is supplied to the wafer 200 (pyridine gas supply). At the same time, the valve 243j is opened to flow an inert gas such as $N_2$ gas or the like into the third inert gas supply pipe 232j. A flow rate of the $N_2$ gas flowing into the third inert gas supply pipe 232j is adjusted by the mass flow controller 241j. The flow rate-adjusted $N_2$ gas is supplied into the process chamber 201, along with the pyridine gas, and is exhausted through the exhaust pipe 231.

In this case, in order to prevent infiltration of the HCDS gas and the pyridine gas into the second nozzle 249b and the fourth nozzle 249d, the valves 243j and 243k are opened to flow $N_2$ gas into the second inert gas supply pipe 232i and the fourth inert gas supply pipe 232k. The $N_2$ gas is supplied into the process chamber 201 via the second gas supply pipe 232b, the fourth gas supply pipe 232d, the second nozzle 249b, and the fourth nozzle 249d and is exhausted through the exhaust pipe 231.

In this case, the APC valve 244 is appropriately adjusted to set the pressure in the process chamber 201 to fall, for example, within a range from 1 to 13,300 Pa, specifically, for example, from 20 to 1,330 Pa, for example, to 1,330 Pa. The flow rate of the HCDS gas controlled by the mass flow controller 241a is set to fall, for example, within a range from 1 to 2,000 sccm. In terms of a ratio of the HCDS gas flow rate (sccm) to the pyridine gas flow rate (sccm), the flow rate of the pyridine gas controlled by the mass flow controller 241c is set to fall, for example, within a range from 0.01 to 100, specifically, for example, from 0.05 to 10. The flow rate of the $N_2$ gas controlled by each of the mass flow controllers 241h, 241i, 241j, and 241k is set to fall, for example, within a range from 100 to 10,000 sccm. A time period of supplying the HCDS gas and the pyridine gas to the wafers 200, i.e., a gas supply time (irradiation time), is set to fall, for example, within a range from 1 to 100 seconds, specifically, for example, from 5 to 30 seconds.

In this case, the heater 207 is set to a temperature such that the temperature of the wafers 200 is set to fall, for example, within a range from room temperature to 200 degrees C., specifically, for example, from room temperature to 150 degrees C., more specifically, for example, from room temperature to 100 degrees C., for example, to a temperature within a range from 65 to 90 degrees C. If no catalyst gas is used, when the temperature of the wafers 200 is less than 250 degrees C., HCDS is hard to be chemically adsorbed on the wafers 200, which may result in difficulty in obtaining a practical film forming rate. In this embodiment, the use of the pyridine gas as a catalyst gas can address this difficulty even when the temperature of the wafers 200 is less than 250 degrees C. Under the existence of the pyridine gas, when the temperature of the wafers 200 is equal to or less than 250 degrees C., further 150 degrees C., even further 100 degrees C., the amount of heat applied to the wafers 200 can be reduced, thereby providing good control of a heat history undergone by the wafers 200. In addition, under the existence of the pyridine gas, when the temperature of the wafers 200 is equal to or higher than room temperature, HCDS can be sufficiently adsorbed on the wafers 200 to obtain a sufficient film forming rate. Accordingly, it is preferable to set the temperature of the wafer 200 to a temperature within a range from room temperature to 200 degrees C., specifically, for example, from room temperature to 150 degrees C., more specifically, for example, from room temperature to 100 degrees C.

Under the above conditions, when the HCDS gas is supplied to the wafers 200, a silicon-containing layer having a thickness, for example, of less than one atomic layer to several atomic layers is formed as a first layer on each of the wafers 200 (an underlying film of a surface). The silicon-containing layer may be a HCDS gas chemical adsorption layer, a silicon (Si) layer, or both. However, for example, the silicon-containing layer may be a layer including silicon (Si) and chlorine (Cl).

In this example, the silicon layer is a generic term including a continuous layer made of silicon (Si), a discontinuous layer made of silicon (Si), or a silicon thin film in which such layers are stacked. The continuous layer made of Si is sometimes referred to as a silicon thin film. Si in the silicon layer also includes Si which is completely decoupled from Cl.

The HCDS gas adsorption layer includes an HCDS gas molecule continuous chemical adsorption layer and an HCDS gas molecule discontinuous chemical adsorption layer. That is, the HCDS gas chemical adsorption layer includes a chemical adsorption layer having a thickness of one molecular layer or less constituted by HCDS molecules. The HCDS ($Si_2Cl_6$) molecules constituting the HCDS gas chemical adsorption layer include those ($Si_xCl_y$ molecules) in which Si is partially decoupled from Cl. That is, the HCDS chemical adsorption layer includes continuous and discontinuous chemical adsorption layers of $Si_2Cl_6$ molecules and/or $Si_xCl_y$ molecules.

As used herein, the phrase "layer having a thickness of less than one atomic layer" means an atomic layer discontinuously formed and the phrase "layer having a thickness of one atomic layer" means an atomic layer continuously formed. Similarly, the phrase "layer having a thickness of less than one molecular layer" means a molecular layer discontinuously formed and the phrase "layer having a thickness of one molecular layer" means a molecular layer continuously formed. Although the silicon-containing layer may include both of the silicon layer and the HCDS chemical adsorption layer, representations such as "one atomic layer," "several atomic layers," and the like are used for the silicon-containing layer.

If the thickness of the silicon-containing layer formed on the wafer 200 exceeds several atomic layers, an effect of modification reaction in Step 2a, which will be described later, may not be applied to the entire silicon-containing layer. The minimum of thickness of the silicon-containing layer which can be formed on the wafer 200 is less than one atomic layer. Accordingly, the thickness of the silicon-containing layer is set to fall within, specifically, for example, a range of less than one atomic layer to several atomic layers. When the thickness of the silicon-containing layer is not thicker than one atomic layer, i.e., one atomic layer or less, an effect of the modification reaction in Step 2a, which will be described later, can be relatively increased, and thus a time required for the modification reaction in Step 2a can be reduced. A time required for forming the silicon-containing layer in Step 1a can also be reduced. As a result, a processing time per one cycle and hence a total processing time can be reduced. In other words, a film formation rate can be increased. In addition, when the thickness of the silicon-containing layer is not thicker than one atomic layer, controllability for uniform film thickness can be improved.

Under a condition where the HCDS gas is self-decomposed (pyrolyzed), i.e., under a condition where a pyrolysis reaction of the HCDS gas occurs, Si is deposited on the wafer 200, thereby forming a silicon layer. Under a condition where the HCDS gas is not self-decomposed (pyrolyzed), i.e., under a condition where no pyrolysis reaction of the HCDS gas occurs, the HCDS gas is chemically adsorbed on the wafer 200, thereby forming the HCDS gas chemical adsorption layer. Formation of the silicon layer on the wafer 200 results in a higher film formation rate than formation of the HCDS gas adsorption layer on the wafer 200.

Figure 6A:
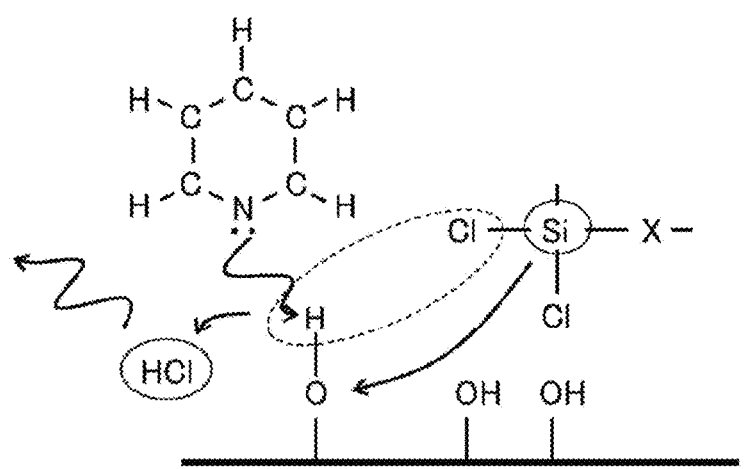
FIG. 6A shows an example of catalyst reaction in the film forming sequence according to the first embodiment of the present disclosure.

Here, the pyridine gas serving as a catalyst having an acid dissociation constant of 5 to 11, specifically, for example, 5 to 7, weakens an O—H bonding force in a surface of the wafer 200 to promote dissociation of the HCDS gas and formation of the silicon-containing layer by chemical adsorption of HCDS molecules. In this case, as shown in FIG. 6A, for example, the pyridine gas serving as a catalyst applies to an O—H bonding existing on a surface of the wafer 200 or the silicon-containing layer to weaken the O—H bonding force. If hydrogen (H), whose bonding force has been weakened, reacts with chlorine (Cl) of the HCDS gas, hydrogen chloride (HCl) gas is generated and separated while the HCDS molecule (halide) without Cl is chemically adsorbed on the surface of the wafer 200 or the like. The above occurs because an N atom having an electron lone pair in a pyridine molecule functions to attract H so that the pyridine gas weakens the O—H bonding force. The acid dissociation constant (pKa) may be an indicator for the intensity of that a certain compound including an N atom or the like attracts H.

As such, a compound having a large acid dissociation constant has a strong force to attract H. For example, use of a compound having an acid dissociation constant of 5 or more as a catalyst promotes dissociation of the HCDS gas and thus formation of the silicon-containing layer. However, if the acid dissociation constant of the catalyst is too large, Cl extracted out of HCDS molecules is bonded with the catalyst and a component which is produced by such combination may become a particle. In order to prevent this, it is preferable that the acid dissociation constant of the catalyst is not larger than 11, specifically, for example, not larger than 7. Accordingly, a catalyst having an acid dissociation constant of 5 to 11, specifically, for example, 5 to 7 may be used. If the acid dissociation constant of the pyridine gas is about 5.67, it is relatively large and has a strong force to attract H. Also, since the acid dissociation constant of the pyridine gas is not larger than 7, particles are rarely produced.

The HCDS gas and the pyridine gas supplied into the process chamber 201 are supplied to not only the wafer 200 but also surfaces of members in the process chamber 201, for example, the inner wall of the reaction tube 203, the inner wall of the manifold 209, and the boat 217 disposed in the process chamber 201. As a result, the above-mentioned silicon-containing layer is formed on the surface of the members in the process chamber 201 as well as the wafer

200. The silicon-containing layer formed on the surface of the members in the process chamber 201 may include a HCDS gas chemical adsorption layer, a Si layer, or both of them, similar to the silicon-containing layer formed on the wafer 200.

The process chamber 201 may include a region whose temperature is approximately equal to the set temperature and another region whose temperature is lower than the set temperature. In the process chamber 201, a region which is surrounded by the heater 207 and horizontally surrounds the wafer arrangement region (hereinafter, referred to as a "near-wafer region") has a temperature which is approximately equal to the set temperature. The near-wafer region has a small temperature variation. On the other hand, a region which is not surrounded by the heater 207 and is out of a region that horizontally surrounds the wafer arrangement region (hereinafter, referred to as an "out-of-wafer arrangement region") has a temperature which is lower than that of the near-wafer region. In comparison to the near-wafer region, the out-of-wafer arrangement region has a higher possibility of HCDS gas adsorption and silicon-containing layer formation. The silicon-containing layer is more likely to be formed in an inner wall near the lower portion of the reaction tube 203, the inner wall of the manifold 209, the lower portions of the first nozzle 249a, the second nozzle 249b, the third nozzle 249c, and the fourth nozzle 249d, the top surface of the seal cap 219, the side portion of the shaft 255, the side and bottom portions of the heat insulating member 218, etc., among the members in the process chamber 201. Similarly, the silicon-containing layer may be more likely to be formed in the inner side of the top surface of the reaction tube 203 which is not covered by the heater 207.

(Residual Gas Removal)

After the silicon-containing layer is formed as the first layer on the wafer 200, the valve 243a of the first gas supply pipe 232a is closed to stop the supply of the HCDS gas. In addition, the valve 243c of the third gas supply pipe 232c is closed to stop the supply of the pyridine gas. At this time, while the APC valve 244 of the exhaust pipe 231 is in an open state, the interior of the process chamber 201 is vacuum-exhausted by the vacuum pump 246 to remove the HCDS and pyridine gases remaining in the process chamber 201, which have not reacted or which or which remain after contributing to the formation of the silicon-containing layer, from the process chamber 201 (residual gas removal). In this case, the valves 243h, 243i, 243j, and 243k are in an open state, and the supply of the $N_2$ gas, as an inert gas, into the process chamber 201 is maintained. The $N_2$ gas acts as a purge gas which is capable of further improving the effect of removing the HCDS and pyridine gases remaining in the process chamber 201, which have not reacted or which remain after contributing to the formation of the silicon-containing layer, from the process chamber 201.

Moreover, in this case, the residual gas in the process chamber 201 may not be completely removed, and the interior of the process chamber 201 may not be completely purged. If an amount of the residual gas in the process chamber 201 is very small, this has no adverse effect on subsequent Step 2a. In this case, there is no need to provide a high flow rate of the $N_2$ gas supplied into the process chamber 201. For example, an approximately same volume of the $N_2$ gas as that of the reaction tube 203 (the process chamber 201) may be supplied into the process chamber 201 to purge the interior of the process chamber 201 to such a degree that does not cause adverse effect on Step 2a. In this way, when the interior of the process chamber 201 is not completely purged, a purge time can be shortened, thereby improving a throughput. This can also limit consumption of the $N_2$ gas to the minimum required for purging.

Figure 14:
FIG. 14 shows a table including names, chemical composition formulas, chemical structural formulas, and acid dissociation constants of N-bonded heterocyclic compounds used as catalysts.
Figure 14:
Figure 14:
Figure 14:
Figure 14:

Examples of the chlorosilane-based precursor gas may include, in addition to the hexachlorodisilane ($Si_2Cl_6$, abbreviated to HCDS) gas, inorganic precursor gases such as tetrachlorosilane, i.e., silicon tetrachloride ($SiCl_4$, abbreviated to STC) gas, trichlorosilane ($SiHCl_3$, abbreviated to TCS), dichlorosilane ($SiH_2Cl_2$, abbreviated to DCS) gas, monochlorosilane ($SiH_3Cl$, abbreviated to MCS) gas, and the like. Examples of the catalyst gas may include, in addition to the pyridine ($C_5H_5N$, pKa=5.67) gas, other gases including an N-bonded heterocyclic compound similar to the pyridine gas such as aminopyridine ($C_5H_6N_2$, pKa=6.89) gas, picoline ($C_6H_7N$, pKa=6.07) gas, piperazine ($C_4H_{10}N_2$, pKa=5.68) gas, lutidine ($C_7H_9N$, pKa=6.96) gas, and the like. Names, chemical composition formula, chemical structural formula, and acid dissociation constants of these heterocyclic compounds are shown in FIG. 14. Examples of the inert gas may include rare gases such as Ar gas, He gas, Ne gas, Xe gas, and the like, in addition to the $N_2$ gas.

[Step 2a]

(Supply of $H_2O$ Gas and Pyridine Gas)

After Step 1a is terminated and the residual gas is removed from the process chamber 201, the valve 243b of the second gas supply pipe 232b is opened to flow $H_2O$ gas into the second gas supply pipe 232b. A flow rate of the $H_2O$ gas flowing into the second gas supply pipe 232b is adjusted by the mass flow controller 241b. The flow rate-adjusted $H_2O$ gas is supplied from the gas supply holes 250b of the second nozzle 249b into the process chamber 201 and is exhausted through the exhaust pipe 231. In this way, the $H_2O$ gas is supplied to the wafers 200 ($H_2O$ gas supply). At the same time, the valve 243i is opened to flow $N_2$ gas as an inert gas into the second inert gas supply pipe 232i. A flow rate of the $N_2$ gas flowing into the second inert gas supply pipe 232i is adjusted by the mass flow controller 241i. The flow rate-adjusted $N_2$ gas is supplied into the process chamber 201, along with the $H_2O$ gas, and is exhausted through the exhaust pipe 231.

In this case, the valve 243c of the third gas supply pipe 232c is opened to flow pyridine gas into the third gas supply pipe 232c. A flow rate of the pyridine gas flowing into the third gas supply pipe 232c is adjusted by the mass flow controller 241c. The flow rate-adjusted pyridine gas is supplied from the gas supply holes 250c of the third nozzle 249c into the process chamber 201 and is exhausted through the exhaust pipe 231. In this way, the pyridine gas is supplied to the wafer 200 (pyridine gas supply). At the same time, the valve 243j is opened to flow an inert gas such as $N_2$ gas or the like into the third inert gas supply pipe 232j. A flow rate of the $N_2$ gas flowing into the third inert gas supply pipe 232j is adjusted by the mass flow controller 241j. The flow rate-adjusted $N_2$ gas is supplied into the process chamber 201, along with the pyridine gas, and is exhausted through the exhaust pipe 231.

In this case, in order to prevent infiltration of the $H_2O$ gas and the pyridine gas into the first nozzle 249a and the fourth nozzle 249d, the valves 243h and 243k are opened to flow $N_2$ gas into the first inert gas supply pipe 232h and the fourth inert gas supply pipe 232k. The $N_2$ gas is supplied into the process chamber 201 via the first gas supply pipe 232a, the fourth gas supply pipe 232d, the first nozzle 249a, and the fourth nozzle 249d, and is exhausted through the exhaust pipe 231.

In this case, the APC valve 244 is appropriately adjusted to set the pressure in the process chamber 201 to fall, for example, within a range from 1 to 13,300 Pa, specifically, for example, from 20 to 1,330 Pa, for example, to 1330 Pa. The flow rate of the $H_2O$ gas controlled by the mass flow controller 241b is set to fall, for example, within a range from 1,000 to 10,000 sccm. In terms of a ratio of the $H_2O$ gas flow rate (sccm) to the pyridine gas flow rate (sccm), the flow rate of the pyridine gas controlled by the mass flow controller 241c is set to fall, for example, within a range from 0.01 to 100, specifically, for example, from 0.05 to 10. The flow rate of the $N_2$ gas controlled by each of the mass flow controllers 241h, 241i, 241j, and 241k is set to fall, for example, within a range from 100 to 10,000 sccm. A time period of supplying the $H_2O$ gas and the pyridine gas to the wafers 200, that is, a gas supply time (irradiation time), is set to fall, for example, within a range from 1 to 100 seconds, specifically, for example, from 5 to 30 seconds. The heater 207 is set to a temperature such that the temperature of the wafers 200 is set to fall within the same temperature range as when the HCDS gas is supplied in Step 1a, i.e., a range, for example, from room temperature to 200 degrees C., specifically, for example, from room temperature to 150 degrees C., more specifically, for example, from room temperature to 100 degrees C., for example, to a temperature within a range from 65 to 90 degrees C.

The $H_2O$ gas supplied into the process chamber 201 is activated by heat and is exhausted through the exhaust pipe 231. In this case, the thermally-activated $H_2O$ gas is supplied to the wafers 200. That is, the gas flowing within the process chamber 201 is the thermally-activated $H_2O$ gas, rather than the HCDS gas. Therefore, the thermally-activated $H_2O$ gas is supplied to the wafers 200 reacts with at least a portion of the first layer (the silicon-containing layer) formed on the wafer 200 in Step 1a (surface reaction), without causing any gaseous reaction. Accordingly, the first layer is thermally oxidized with non-plasma and is changed (modified) into a second layer including silicon and oxygen, i.e., a silicon oxide layer (SiO layer).

Figure 6B:
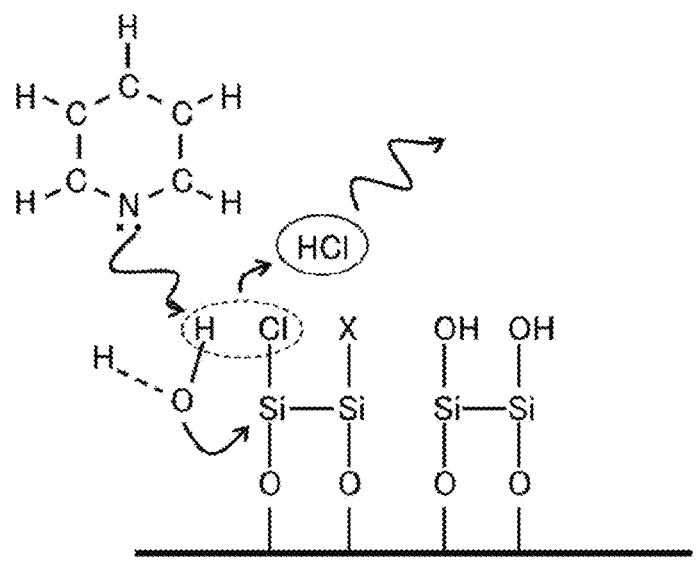
FIG. 6B shows another example of catalyst reaction in the film forming sequence according to the first embodiment of the present disclosure.

In this case, the pyridine gas serving as a catalyst having an acid dissociation constant of 5 to 11, specifically, for example, 5 to 7, weakens an O—H bonding force in the $H_2O$ gas to promote $H_2O$ gas dissociation and thus reaction of $H_2O$ molecules with the silicon-containing layer. As such, as shown in FIG. 6B, for example, the pyridine gas serving as a catalyst applies to the O—H bonding of the $H_2O$ gas to weaken its O—H bonding force. When H whose bonding force has been weakened reacts with Cl included in the silicon-containing layer formed on the wafer 200, a hydrogen chloride (HCl) gas is generated and separated and thus, O in the $H_2O$ gas without H is bonded with Si in the silicon-containing layer without Cl.

The activated $H_2O$ gas and the pyridine gas in the process chamber 201 are supplied to not only the wafer 200 but also surfaces of members in the process chamber 201, for example, the inner wall of the reaction tube 203 and so on. As a result, at least a portion of the silicon-containing layer formed on the surfaces of the members in the process chamber 201 is changed (modified) into a silicon oxide layer, similar to the silicon-containing layer formed on the wafer 200.

However, the temperature and the activation degree of the supplied $H_2O$ gas within the above-mentioned out-of-wafer arrangement region in the process chamber 201 may be lower than those within the above-mentioned near-wafer region. In addition, the out-of-wafer arrangement region in the process chamber 201 has a higher possibility of $H_2O$ gas adsorption than the near-wafer region. As a result, as none or only a portion of the $H_2O$ gas supplied into the out-of-wafer reacts, it may easily be introduced into and stay in the silicon-containing layer without sufficient oxidation. As such, $H_2O$ molecules (water) without sufficient oxidation, none or a portion of which has reacted, are highly likely to stay in the silicon-containing layer formed on the inner wall near the lower portion of the reaction tube 203, the inner wall of the manifold 209, the lower portions of the first nozzle 249a, the second nozzle 249b, the third nozzle 249c, and the fourth nozzle 249d, the top surface of the seal cap 219, the side portion of the shaft 255, the side and bottom portions of the heat insulating member 218, etc., of the members in the process chamber 201. This effect may be equally produced in the inner side of the top surface of the reaction tube 203, which is not covered by the heater 207.

(Residual Gas Removal)

Thereafter, the valve 243b of the second gas supply pipe 232b is closed to stop the supply of the $H_2O$ gas. In addition, the valve 243c of the third gas supply pipe 232c is closed to stop the supply of the pyridine gas. At this time, while the APC valve 244 of the exhaust pipe 231 is in an open state, the interior of the process chamber 201 is vacuum-exhausted by the vacuum pump 246 to remove the $H_2O$ and pyridine gases remaining in the process chamber 201, which have not reacted or which remain after contributing to the reaction, and reaction byproducts from the process chamber 201 (residual gas removal). In this case, the valves 243h, 243i, 243j, and 243k are in an open state, the supply of the $N_2$ gas, as an inert gas, into the process chamber 201 is maintained.

The $N_2$ gas acts as a purge gas which is capable of further improving the effect of removing the $H_2O$ and pyridine gases remaining in the process chamber 201, which have not reacted or which remain after contributing to the reaction, and the reaction byproducts from the process chamber 201.

Moreover, in this case, the residual gas in the process chamber 201 may not be completely removed and the interior of the process chamber 201 may not be completely purged. If an amount of the residual gas in the process chamber 201 is very small, this has no adverse effect on the subsequent Step 1a. In this case, there is no need to provide a high flow rate of the $N_2$ gas supplied into the process chamber 201. For example, an approximately same volume of the $N_2$ gas as that of the reaction tube 203 (the process chamber 201) may be supplied into the process chamber 201 to purge the interior of the process chamber 201 to such a degree that does not cause an adverse effect on Step 1a. In this way, when the interior of the process chamber 201 is not completely purged, a purge time can be shortened, thereby improving a throughput. This can also limit consumption of the $N_2$ gas to the minimum required for purging.

Examples of the oxidation gas may include hydrogen peroxide ($H_2O_2$) gas, hydrogen ($H_2$)+oxygen ($O_2$) gas, hydrogen ($H_2$)+ozone ($O_3$) gas, and the like, in addition to the $H_2O$ gas. Examples of the catalyst gas may include a variety of gases including N-added heterocyclic compounds as described above, in addition to the pyridine gas. Examples of the inert gas may include rare gases such as Ar gas, He gas, Ne gas, Xe gas, and the like, in addition to the $N_2$ gas.

(Performing Predetermined Number of Times)

When one cycle including above-described Steps 1a and 2a is performed one or more times (i.e., a predetermined number of times), it is possible to form a silicon oxide film (SiO film) having a predetermined composition and a predetermined film thickness on the wafer 200. The one cycle may be repeated multiple times. Thus, it is preferable that a thickness of a SiO layer formed per cycle is set to be smaller than a desired thickness and the cycle is repeated several multiple until the desired thickness of the SiO layer is obtained.

In this case, when process conditions such as the pressure in the process chamber 201, the gas supply time, and so on in each step are controlled, a ratio of the element components (i.e., silicon and oxygen components) in the SiO layer, i.e., a silicon concentration and an oxygen concentration, can be adjusted. Thus, a composition ratio of the SiO film can be controlled.

Also, when the cycle is performed multiple times, the phrase "a predetermined gas is supplied to the wafer 200" in each step from at least two cycles means that a predetermined gas is supplied to a layer formed on the wafer 200, i.e., the uppermost surface of the wafer 200, which is a laminated body. The phrase "a predetermined layer is formed on the wafer 200" means that a predetermined layer is formed on a layer formed on the wafer 200, i.e., the uppermost surface of the wafer 200, which is a laminated body. Also, above-described matters are similar in other embodiments or individual modifications described later.

In addition, as the cycle is performed a predetermined number of times, deposits including a SiO film as a thin film are deposited on the surfaces of the members in the process chamber 201 such as the inner wall of the reaction tube 203 and the like. The components of the deposits, other than the component of the SiO film, may include an insufficiently-oxidized silicon oxide layer and the like, in which unreacted water ($H_2O$) remains. Such components may appear in the above-mentioned out-of-wafer arrangement region. In this way, the components different from the SiO film formed on the wafer 200, for which a temperature and gas flow rates are relatively precisely controlled, are deposited on the surface of the members in the process chamber 201. In a boat unload which will be described later, at least a portion of the SiO film may be deformed due to water included in the outside air (the atmosphere) introduced from a bottom opening of the manifold 209 into the process chamber 201. In addition, for the above-mentioned reasons, the SiO film or the deposits containing a relatively large amount of water may be formed to be relatively thick in the out-of-wafer arrangement region having a relatively low temperature, i.e., the inner wall near the lower portion of the reaction tube 203, the inner wall of the manifold 209, the lower portions of the first nozzle 249a, the second nozzle 249b, the third nozzle 249c, and the fourth nozzle 249d, the top surface of the seal cap 219, the side portion of the shaft 255, the side and bottom portions of the heat insulating member 218, etc., of the members in the process chamber 201. This effect may be equally produced in the inner side of the top surface of the reaction tube 203, which is not covered by the heater 207. In the inner side of the top surface of the reaction tube 203 having a relatively large area but a slightly less purge efficiency, the amount of water in the deposits may be increased due to even a small amount of remaining $H_2O$ gas, although the above cycle that includes the process of removing the residual gas is performed a predetermined number of times.

(Purge and Return to Atmospheric Pressure)

Once the film formation process of forming the SiO film having a predetermined composition and a predetermined film thickness is completed, the valves 243h, 243i, 243j, and 243k are opened and the $N_2$ gas as inert gases is supplied from each of the first inert gas supply pipe 232h, second inert gas supply pipe 232i, third inert gas supply pipe 232j, and fourth inert gas supply pipe 232k into the process chamber 201 and are exhausted through the exhaust pipe 231 such that the interior of the process chamber 201 is purged by the inert gas (gas purge), thereby removing gas and reaction byproducts remaining in the process chamber 201 from the process chamber 201 (purge). Thereafter, the internal atmosphere of the process chamber 201 is substituted with the inert gas (inert gas substitution), and the pressure in the process chamber 201 returns to the atmospheric pressure (return to atmospheric pressure).

(Boat Unload and Wafer Discharge)

The seal cap 219 is lowered by the boat elevator 115 to open the bottom of the reaction tube 203, and the processed wafers 200 supported by the boat 217 are unloaded to the outside of the reaction tube 203 through the lower end portion of the manifold 209 (boat unload). Then, the processed wafers 200 are discharged from the boat 217 (wafer discharge).

Thereafter, a process from the above-described wafer charge to the above-described wafer discharge (hereinafter, referred to as a batch process) is performed a predetermined number of times. In this case, if the above-mentioned deposits are deposited, some of the deposits may be peeled off and dropped, which may cause particles. In addition, for example, when the $H_2O$ gas of a low temperature is used to form a thin film as described in this embodiment, the in-plane uniformity in film thickness and film quality of the SiO film formed on the wafer may be deteriorated due to the water ($H_2O$) extracted from the deposits formed on the members in the process chamber 201.

As described above, for example, when the $H_2O$ gas is used to form a thin film at a low temperature of not higher than 100 degrees C., deposits including a large amount of water may be deposited on the members in the process chamber. For example, in case where HCDS gas is supplied to form a SiO film on the wafer, if water is extracted from the deposits into the process chamber, the HCDS gas reacts with the water ($H_2O$) to cause a gaseous reaction. Such a gaseous reaction is dominant in a plane of the wafer, particularly, in a periphery portion of the wafer, which is close to the members in the process chamber. Thus, a SiO film formed in the periphery portion of the wafer 200 may be increased in film thickness and changed in film quality, which may result in in-plane non-uniformity of thickness and quality of the SiO film.

As described above, such in-plane non-uniformity of thickness and quality is particularly significant in the wafers 200 which are disposed near the bottom portion of the boat close to the out-of-wafer arrangement region, for example, the inner wall near the lower portion of the reaction tube 203, the inner wall of the manifold, the lower portions of the first nozzle, the second nozzle, the third nozzle, and the fourth nozzle, the top surface of the seal cap, the side portion of the shaft, the side and bottom portions of the heat insulating member, etc., in which deposits including a relatively large amount of water are formed to be relatively thick. In addition, since the neighborhood of the top portion of the boat is positioned near the top surface of the reaction tube not covered by the heater, the in-plane uniformity may be also deteriorated in wafers disposed near the top of the boat.

For the purpose of addressing these problems, a cleaning process may be performed to supply a cleaning gas into the process chamber to remove the deposits formed on the members in the process chamber, thereby preventing particles. It is believed that such a cleaning process can prevent deterioration of in-plane uniformity of thickness and quality of the SiO film by removing deposits acting as a source of water.

However, the inner wall near the bottom portion of the reaction tube, the inner wall of the manifold, the lower portions of the first nozzle, the second nozzle, the third nozzle, and the fourth nozzle, the top surface of the seal cap, the side portion of the shaft, the side and bottom portions of the heat insulating member, etc., on which deposits are more likely to be formed to be relatively thick, have a structure having relatively intricate narrow gaps. This structure makes it difficult for a cleaning gas to reach the surfaces of these members, as opposed to surfaces of members positioned in the above-mentioned near-wafer region, which may result in poor cleaning efficiency and incomplete removal of deposits from these members.

Accordingly, in this embodiment, the following cleaning process is performed to more reliably remove deposits formed in the process chamber 201, thereby improving in-plane uniformity of thickness and quality of a SiO film formed on the wafer 200.

(3) Cleaning Process

Figure 7:
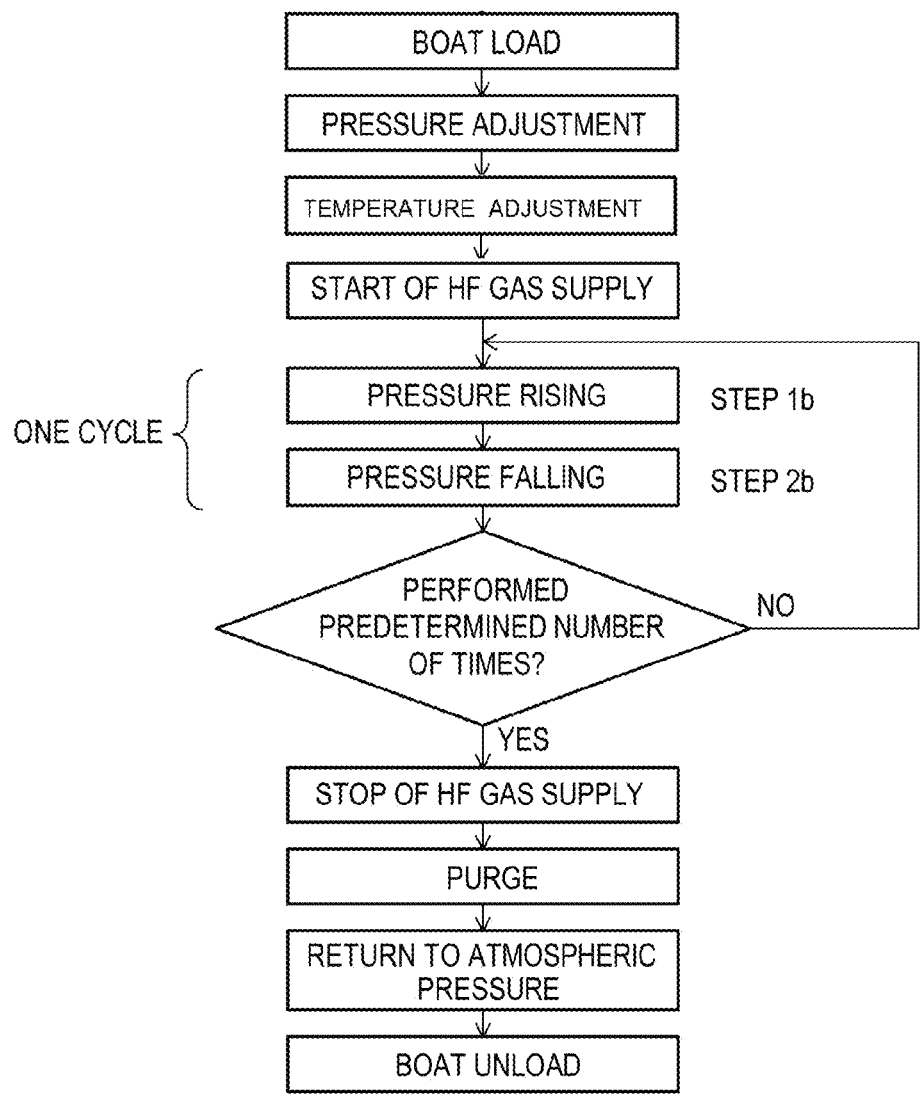
FIG. 7 depicts a flowchart for a cleaning sequence according to the first embodiment of the present disclosure.
Figure 8:
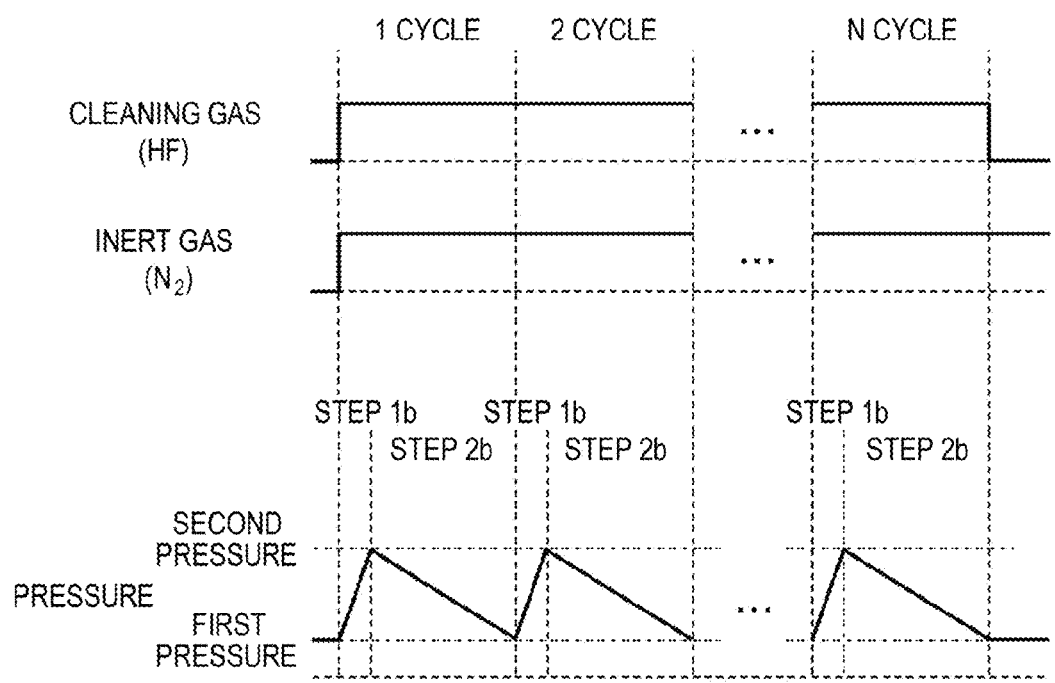
FIG. 8 depicts a timing diagram for supplying a plurality of gases and changing a pressure in the cleaning sequence according to the first embodiment of the present disclosure.

Hereinafter, a sequence of cleaning the interior of the process chamber 201 will be described with reference to FIGS. 7 and 8. FIG. 7 depicts a flowchart for a cleaning sequence according to the first embodiment of the present disclosure. FIG. 8 depicts a timing diagram for supplying a plurality of gases and changing a pressure in the cleaning sequence according to the first embodiment of the present disclosure. In the following description, the controller 121 controls operations of various components constituting the substrate processing apparatus.

The process of cleaning the interior of the process chamber 201 is performed at the point of time when deposits formed on the members in the process chamber 201 reach a certain thickness and before the deposits are peeled off or dropped or in-plane uniformity of thickness and quality of a SiO film formed on the wafer 200 is deteriorated.

This embodiment provides a cleaning sequence of cleaning an interior of a process chamber by supplying a cleaning gas into the process chamber after a process of forming a thin film on a substrate in the process chamber is performed, the cleaning sequence including alternately repeating, in a state where supplying the cleaning gas into the process chamber is maintained, changing a pressure in the process chamber from a first pressure range to a second pressure range, and changing the pressure in the process chamber from the second pressure range to the first pressure range, wherein in the act of alternately repeating the acts of changing the pressure in the process chamber, when the pressure in the process chamber is changed to the first pressure range after being changed to the second pressure range, the pressure in the process chamber is changed to the first pressure range without being maintained at the second pressure range, and when the pressure in the process chamber is changed to the second pressure range after being changed to the first pressure range, the pressure in the process chamber is changed to the second pressure range without being maintained at the first pressure range.

As used herein, the first pressure range refers to a pressure range having a first range, and the second pressure range refers to a pressure range having a second range that does not overlap the first range. The phrase "changing the pressure in the process chamber from a first pressure range to a second pressure range" means changing the pressure in the process chamber 201 from a first pressure included in the first pressure range to a second pressure included in the second pressure range. The phrase "changing the pressure in the process chamber from a second pressure range to a first pressure range" means changing the pressure in the process chamber 201 from a second pressure included in the second pressure range to a first pressure included in the first pressure range. As the above processes are alternately repeated, the first pressure included in the first pressure range may be fixed or changed. Similarly, as the above processes are alternately repeated, the second pressure included in the second pressure range may be fixed or changed.

The cleaning sequence of this embodiment will be described in detail later. Here, an example of supplying only a cleaning gas, for example, HF gas diluted with $N_2$ gas serving as an inert gas, into the process chamber 201 which is heated to a predetermined temperature or maintained at room temperature, and removing deposits formed in the process chamber 201 by a thermochemical reaction, according to the cleaning flow of FIG. 7 and the cleaning sequence of FIG. 8 will be described.

(Boat Load)

The empty boat 217 with no wafers 200 loaded thereon is lifted up and loaded into the process chamber 201 by the boat elevator 115 (boat load). In this state, the seal cap 219 seals the bottom of the reaction tube 203 via the O-ring 220b.

(Pressure Adjustment and Temperature Adjustment)

The interior of the process chamber 201 is vacuum-exhausted by the vacuum pump 246 to set the interior to a desired pressure (a vacuum level). Here, the pressure in the process chamber 201 is measured by the pressure sensor 245 and the APC valve 244 is feedback-controlled based on the measured pressure information (pressure adjustment). Also, the vacuum pump 246 maintains a regular operation state at least until the cleaning process is terminated. The interior of the process chamber 201 is heated by the heater 207 to set the interior to a desired temperature. In this case, an electric conduction state to the heater 207 is feedback-controlled based on the temperature information detected by the temperature sensor 263 such that the interior of the process chamber 201 has a desired temperature distribution (temperature adjustment). The heating of the interior of the process chamber 201 by the heater 207 continues at least until the cleaning process is terminated. However, if the cleaning process is performed at room temperature, the heating of the interior of the process chamber 201 by the heater 207 may not be performed. Subsequently, the boat 217 begins to be rotated by the rotation mechanism 267. The rotation of the boat 217 by the rotation mechanism 267 continues at least until the cleaning process is terminated. However, the boat 217 may not be rotated.

(Start of HF Gas Supply)

The valve 243d of the fourth gas supply pipe 232d is opened to flow HF gas into the fourth gas supply pipe 232d. A flow rate of the HF gas flowing into the fourth gas supply pipe 232d is adjusted by the mass flow controller 241d. The flow rate-adjusted HF gas is supplied from the gas supply hole 250d of the fourth nozzle 249d into the process chamber 201 and is exhausted through the exhaust pipe 231 (start of HF gas supply). At the same time, the valve 243k is opened to flow an inert gas such as $N_2$ gas into the fourth inert gas supply pipe 232k. A flow rate of the $N_2$ gas flowing into the fourth inert gas supply pipe 232k is adjusted by the mass flow controller 241k. The flow rate-adjusted $N_2$ gas is supplied into the process chamber 201, along with the HF gas, and is exhausted through the exhaust pipe 231. In this way, since the fourth nozzle 249d configured as a short nozzle is used to supply the HF gas into the process chamber 201, a path in the nozzle into which the HF gas is flown can be shortened, as opposed to a long nozzle. Accordingly, the damage to the fourth nozzle 249d due to the HF gas can be reduced, which may lead to an extended life of the fourth nozzle 249d.

In addition to or instead of the supply of the HF gas from the fourth nozzle 249d via the valve 243d, the valve 243e in the fourth gas supply pipe 232d that is connected to the first gas supply pipe 232a is opened to flow the HF gas, whose flow rate is adjusted by the mass flow controller 241d, into the first gas supply pipe 232a. The HF gas flowing into the first gas supply pipe 232a is supplied from the gas supply holes 250a of the first nozzle 249a into the process chamber 201 and is exhausted through the exhaust pipe 231 (start of HF gas supply). At the same time, the valve 243h is opened to flow an inert gas such as $N_2$ gas into the first inert gas supply pipe 232h. A flow rate of the $N_2$ gas flowing into the first inert gas supply pipe 232h is adjusted by the mass flow controller 241h. The flow rate-adjusted $N_2$ gas is supplied into the process chamber 201, along with the HF gas, and is exhausted through the exhaust pipe 231. In this way, when the first nozzle 249a for supplying the HCDS gas is used to supply the HF gas into the process chamber 201, for example, a silicon-containing layer or the like formed within the first nozzle 249a due to supply of the HCDS gas can be removed by the HF gas.

In this case, in order to prevent infiltration of the HF gas into other nozzles, i.e., the second nozzle 249b, and the third nozzle 249c, the valves 243i and 243j are opened to flow $N_2$ gas into the second inert gas supply pipe 232i and the third inert gas supply pipe 232j. The $N_2$ gas is supplied into the process chamber 201 via the second gas supply pipe 232b, the third gas supply pipe 232c, the second nozzle 249b, and the third nozzle 249c, and is exhausted through the exhaust pipe 231. In this way, as at least the second nozzle 249b and the third nozzle 249c are not used to supply the HF gas, the second nozzle 249b and the third nozzle 249c can be prevented from being damaged due to the HF gas, which can lead to extended life of the second nozzle 249b and the third nozzle 249c.

In this case, the APC valve 244 is appropriately adjusted to set the pressure in the process chamber 201 to a predetermined pressure (first pressure) included in a first pressure range, for example, to 133 Pa (1 Torr) which is a pressure, for example, within a pressure range from 13 to 2,660 Pa (0.1 to 20 Ton). The flow rate of the HF gas controlled by the mass flow controller 241d is set to fall, for example, within a range from 500 to 3,000 sccm. The flow rate of the $N_2$ gas controlled by the mass flow controllers 241h, 241i, 241j, and 241k is set to fall, for example, within a range of 500 to 10,000 sccm in total. In addition, a ratio of the HF gas flow rate (sccm) to the $N_2$ gas flow rate is set to fall within a range from 0.1 to 1.0, specifically, for example, from 0.2 to 0.3. In this case, if this ratio is set to be high, a removal rate (etching rate) of deposits formed on the members in the process chamber 201 is increased. However, if this ratio is too high, the members are susceptible to damage due to the HF gas. Accordingly, it is beneficial to set the flow rate ratio of the HF gas to the $N_2$ gas to fall within a range from 0.1 to 1.0, specifically, for example, 0.2 to 0.3. The supply of the HF gas and the $N_2$ gas into the process chamber 201 continues with the constant flow rate maintained at least until the cleaning process is terminated.

In addition, the heater 207 is set to a temperature such that the temperature of the process chamber 201 is set to fall, for example, within a range from room temperature to 200 degrees C., specifically, for example, from room temperature to 150 degrees C., more specifically, for example, from room temperature to 100 degrees C., for example, to a temperature of 100 degrees C. If the temperature of the process chamber 201 exceeds 200 degrees C., the deposits formed on the members in the process chamber 201 may be contracted, partially peeled off, dropped and, stacked near the furnace opening. In this way, the peeled and dropped deposits may be result in becoming particles. This problem can be overcome when the temperature of the process chamber 201 is set to not be higher than 200 degrees C. When the temperature of the process chamber 201 is set to equal to or lower than 150 degrees C., or equal to or lower than 100 degrees C., it becomes difficult for the deposits to be contracted, and thus, generation of particles is reduced. A thermochemical reaction of the deposits including the SiO film with the HF gas, which will be described later, is caused by water ($H_2O$) that is included in the deposits and acts as a trigger. It is difficult to progress this thermochemical reaction without water. When the temperature of the process chamber 201 is set to not less than room temperature, a sufficient amount of water can be extracted from the deposits to promote the thermochemical reaction of the HF gas with the deposits, thereby removing the deposits from the members in the process chamber 201. Accordingly, it is beneficial to set the temperature of the process chamber 201 to a temperature, for example, within a range from room temperature to 200 degrees C., specifically, for example, from room temperature to 150 degrees C., more specifically, for example, from room temperature to 100 degrees C.

(Deposit Removing Process)

After the internal pressure, the gas flow rates, and the temperature in the process chamber 201 are set to predetermined values, the following two steps, i.e., Step 1b and 2b, are sequentially performed.

[Step 1b]
(Pressure Rising)

While maintaining the supply of the HF gas and the $N_2$ gas at constant flow rates, the APC valve 244 is appropriately adjusted to change the pressure in the process chamber 201 from a first pressure (e.g., 133 Pa (1 Torr)) included in the first pressure range to a second pressure (e.g., 6,650 Pa (50 Torr)) included in a second pressure range (e.g., a pressure range of 5,320 to 13,300 Pa (40 to 100 Torr)). As such, the pressure in the process chamber 201 is controlled to rise from the lower first pressure to the higher second pressure, while feeding back information on the pressure in the process chamber 201 detected by the pressure sensor 245, by reducing a degree of opening of the APC valve 244 (i.e., changing the valve in a closing way) to decrease an exhaust flow rate of the HF gas and the $N_2$ gas through the exhaust pipe 231. In this case, the opening degree of the APC valve 244 is adjusted such that a time taken until the pressure in the process chamber 201 reaches the second pressure from the first pressure becomes, for example, 1 to 180 seconds, specifically, for example, 50 to 70 seconds.

[Step 2b]
(Pressure Falling)

When the pressure in the process chamber 201 reaches the second pressure, while maintaining the supply of the HF gas and the $N_2$ gas at the constant flow rates, the APC valve 244 is appropriately adjusted to change the pressure in the process chamber 201 from the second pressure included in the second pressure range to the first pressure included in the first pressure range. In this case, the pressure in the process chamber 201 is changed to the first pressure range without being maintained at the second pressure range. As such, when it is detected that the pressure in the process chamber 201 reaches the second pressure, an operation of increasing the opening degree of the APC valve (changing the valve in an opening manner) is started immediately. Alternatively, a pressure immediately before the pressure in the process chamber 201 reaches the second pressure may be detected as an operation starting pressure in consideration of a slow change in the pressure in the process chamber 201. Then, the pressure in the process chamber 201 is controlled to fall from the second pressure to the first pressure, while feeding-back information on the pressure in the process chamber 201 detected by the pressure sensor 245, by increasing the opening degree of the APC valve 244 to increase the exhaust flow rate of the HF gas and the $N_2$ gas through the exhaust pipe 231. In this case, the opening degree of the APC valve 244 is adjusted such that a time taken until the pressure in the process chamber 201 reaches the first pressure from the second pressure becomes, for example, 1 to 180 seconds, specifically, for example, 80 to 100 seconds.

In addition, when the pressure in the process chamber 201 is changed from the first pressure to the second pressure in subsequent Step 1b, the pressure in the process chamber 201 is changed to the second pressure range without being maintained at the first pressure range. That is, when it is detected that the pressure in the process chamber 201 reaches the first pressure (or immediately before reaching the first pressure), an operation of decreasing the opening degree of the APC valve is started immediately. Thus, the pressure in the process chamber 201 is increased from the first pressure to the second pressure, as in the above.

In the two steps, i.e., Steps 1b and 2b, the HF gas supplied into the process chamber 201 is activated by heat and is exhausted through the exhaust pipe 231. In this case, the thermally-activated HF gas is provided to the deposits formed on the members in the process chamber 201, such as the inner wall of the reaction tube 203, the inner wall of the manifold 209, the boat 217 installed in the process chamber 201 and so on, and on surfaces thereof. Thus, under a non-plasma atmosphere, the SiO film included in the deposits makes a thermochemical reaction with the thermally-activated HF gas and is accordingly changed into a gaseous silicon fluoride ($SiF_4$), thereby removing the deposits formed on the members. Here, as described above, water extracted from the deposits acts as a trigger to cause the thermochemical reaction. In this way, by removing the deposits by the thermochemical reaction under the non-plasma atmosphere, the reaction by the HF gas is relatively softly progressed to remove the deposits while reducing the damage to the members in the process chamber 201.

Figure 15:
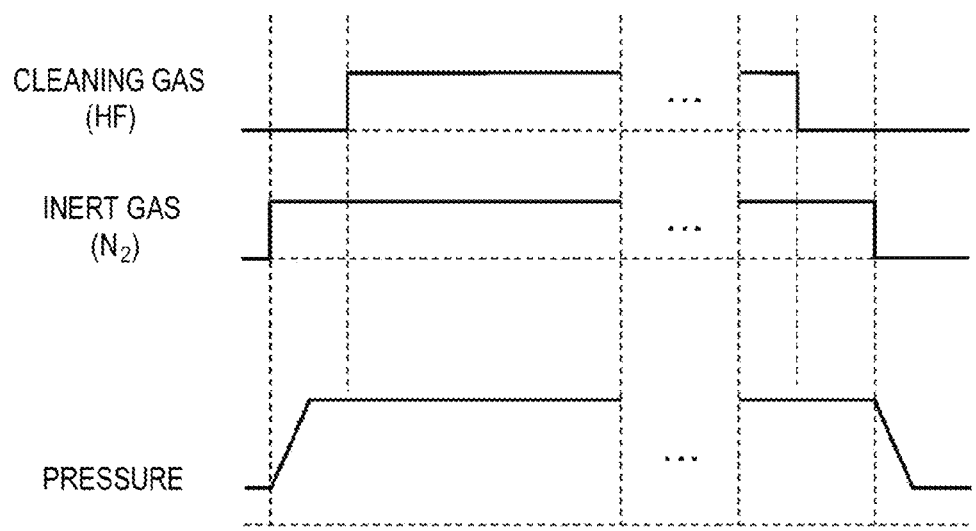
FIG. 15 depicts a timing diagram for supplying a plurality of gases and changing a pressure in a conventional cleaning sequence.

In conventional cleaning processes, a cleaning operation of supplying HF gas and $N_2$ gas at certain flow rates into a process chamber and removing deposits while maintaining the internal pressure of the process chamber at a constant pressure was performed, for example as shown in FIG. 15. However, the above-mentioned out-of-wafer arrangement region, for example, the inner wall near the lower portion of the reaction tube, the inner wall of the manifold, the lower portions of the various nozzles, the top surface of the seal cap, the side portion of the shaft, the side and bottom portions of the heat insulating member, etc., have a structure having relatively intricate narrow gaps, making it difficult for the HF gas to turn around into the surfaces of these members. Accordingly, the surfaces of the members positioned in the out-of-wafer arrangement region have poor etching efficiency of the deposits, as opposed to the surfaces of members positioned in the near-wafer region. Since the deposits on the members positioned in the out-of-wafer arrangement region are relatively thick, the deposits are incompletely removed from these members. If the cleaning time is extended to completely remove the deposits on the members, the down-time of a substrate processing apparatus is extended and members in the near-wafer region may be over etched to have damage to the members.

As described above, the HF gas and the $N_2$ gas are flown from the gas supply holes of the nozzles toward the exhaust pipe via a variety of paths in the process chamber. If the HF gas and the $N_2$ gas are supplied at constant flow rates into the process chamber and the internal pressure of the process chamber remains constant as in the conventional cleaning processes, a molar flux in each path of the HF gas and the $N_2$ gas to the exhaust pipe is relatively small and is little changed. As used herein, a mol flow rate refers to the number of mols of a gas flowing per unit time and unit area and may be expressed in the unit of "$kmol/m^2 \cdot s$". Thus, a mol flow rate indicates a physical quantity which is obtained by dividing the number of mols of gas (HF gas and $N_2$ gas in this example) that passes through a section in a path (gas passage) per unit time into the number of mols of gas that passes through unit area per unit time.

The molar flux is proportional to a difference in pressure between an upstream end and a downstream end of each of paths through which gas such as the HF gas and the $N_2$ gas is flown, and is inversely proportional to a flow resistance in each of paths, through which the gas is flown. It may be here considered that the upstream end of each of the paths through which the HF gas and the $N_2$ gas are flown is a gas supply hole of a nozzle and its downstream end is the exhaust pipe. In addition, if a supply flow rate of gas is constant and the internal pressure of the process chamber kept constant, it may be considered that the supply flow rate of the gas per unit time is approximately equal to an exhaust flow rate of the gas per unit time although there may be some variation in decomposition of gas by the thermochemical reaction and reaction byproducts generated due to the gas decomposition. Accordingly, in this case, since a difference in pressure between paths, through which the gas is flown, is small and is little changed, it may be considered that a molar flux is stabilized at a small value, as described above. Even in a case where the pressure in the process chamber remains as low as possible, since a pressure difference is hardly caused even though the supply flow rate of gas per unit time and the exhaust flow rate of gas per unit time are slightly increased, a molar flux cannot be greatly increased.

In addition, the flow resistance in each of the paths, through which gas is flown, is increased by various factors in the paths which may impede the gas flow. Examples of the factors may include a surface roughness of each member in the process chamber, a curvature or angle of each part thereof, a diameter (section) of each path (gas passage), etc. Accordingly, it is considered that the flow resistance is increased in the above-described out-of-wafer arrangement region having relatively intricate narrow gaps and the molar flux is even more decreased. This hinders the gas from turning around into the out-of-wafer arrangement region, which may result in low etching efficiency of deposits and generation of residues (residual films) to be removed later.

Accordingly, in this embodiment, as described above, Steps 1b and 2b are sequentially performed while changing the pressure in the process chamber 201 in rising and falling manners. In the pressure falling in Step 2b, the opening degree of the APC valve 244 is increased to increase the exhaust flow rate through the exhaust pipe 231 with respect to the supply flow rates of the HF gas and the $N_2$ gas, thereby decreasing the pressure in the process chamber 201. Accordingly, while decreasing the internal pressure, a pressure in the vicinity of the exhaust pipe 231 becomes lower than that in the vicinity of each of the nozzles 249a, 249b, 249c, and 249d to increase a pressure difference therebetween, thereby improving the molar flux of the HF gas and the $N_2$ gas for each path. In this way, the flow of the HF gas and the $N_2$ gas with the increased molar flux gets momentum and are spread over a wider range of places in the process chamber 201. As a result, the HF gas and the $N_2$ gas can be introduced into not only members in the near-wafer region where the gases can originally easily reach, but also the narrow gaps defined by the inner wall near the lower portion of the reaction tube 203, the inner wall of the manifold 209, the lower portions of the first nozzle 249a, the second nozzle 249b, the third nozzle 249c, and the fourth nozzle 249d, the top surface of the seal cap 219, the side portion of the shaft 255, the side and bottom portions of the heat insulating member 218, etc. Accordingly, the HF gas and the $N_2$ gas can turn around into the narrow gaps in the out-of-wafer arrangement region, thereby improving etching efficiency of deposits on members in the out-of-wafer arrangement region. Thus, in Step 2b, deposits in the out-of-wafer arrangement region as well as the near-wafer region can be removed.

On the other hand, Step 1b of raising the pressure in the process chamber 201 quickly after Step 2b is performed as a step before performing Step 2b again. However, Step 1b is not limited to this purpose. Surely, since the exhaust flow rate of gas from the exhaust pipe 231 is decreased while raising the internal pressure in Step 1b, a pressure difference between the vicinity of each of the nozzles 249a, 249b, 249c, and 249d and the vicinity of the exhaust pipe 231 is not so large to anticipate an effect of introduction of gases into the out-of-wafer arrangement region as in Step 2b. However, even in this state, the HF gas and the $N_2$ gas can reach at least the surfaces of the members in the near-wafer region to remove deposits on these members. In addition, it is considered that, when the pressure in the process chamber 201 increases, the densities of the HF gas and the $N_2$ gas are increased to improve an etching rate for the deposits on these members.

In this way, in view of the combination of Steps 1b and 2b, a difference in etching rate between the out-of-wafer arrangement region and the near-wafer region is reduced to improve the overall etching rate of deposits.

Figure 9A:
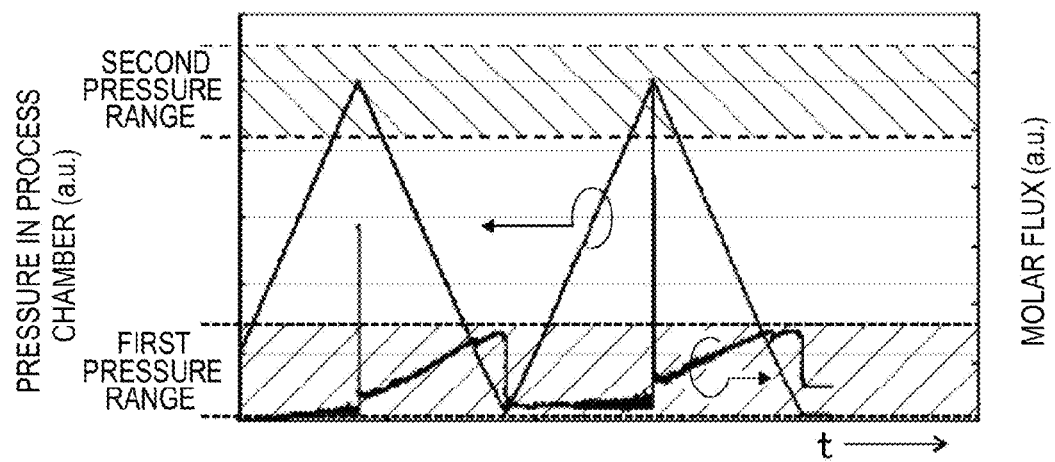
FIG. 9A illustrates a graph showing a result of a simulation to obtain a relationship between a pressure in the process chamber and a molar flux of HF gas, according to the cleaning sequence of the first embodiment of the present disclosure.
Figure 9B:
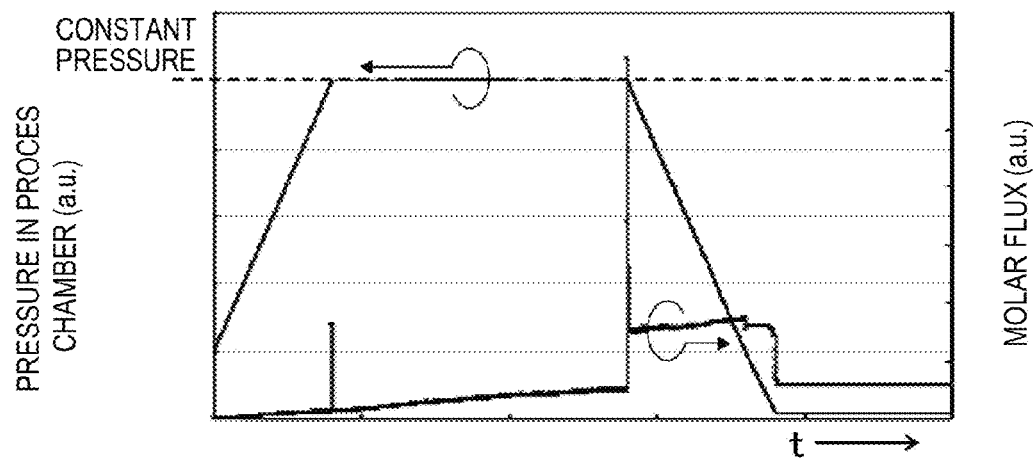
FIG. 9B illustrates a graph showing a result of a simulation to obtain a relationship between a pressure in the process chamber and a molar flux of HF gas, according to a conventional cleaning sequence.

FIG. 9A illustrates a graph showing a result of a simulation to obtain a relationship between a pressure in the process chamber and a molar flux of HF gas, according to the cleaning sequence of the first embodiment of the present disclosure. FIG. 9B illustrates a graph showing a result of a simulation to obtain a relationship between a pressure in the process chamber and a molar flux of HF gas, according to a conventional cleaning sequence. In the graphs, a left vertical axis represents the pressure (a.u.: arbitrary unit) in the process chamber, a right vertical axis represents a molar flux (a.u.: arbitrary unit) in the process chamber by simulation, and a horizontal axis represents time (t). The result shown in FIG. 9A is obtained with a setting of changing the pressure in the process chamber from a first pressure range to a second pressure range. The result shown in FIG. 9B is obtained with a setting of keeping the pressure in the process chamber constant.

It can be seen from the simulation result of FIG. 9A that the molar flux is greatly increased when the pressure in the process chamber is changed, particularly, dropped. It can be seen from the simulation result of FIG. 9B that the molar flux is small and little changed when the internal pressure of the process chamber remains constant. In FIG. 9B, the rising of the molar flux appearing in the latter part of the graph is attributed to a reduced pressure due to residual gas removal.

Thus, it is confirmed that the molar flux shows the behavior as described above depending on the internal pressure of the process chamber.

Examples of the cleaning gas may include other fluorine-based gases, in addition to the HF gas. For example, at least one of hydrogen fluoride (HF) gas, fluorine ($F_2$) gas, nitrogen fluoride ($NF_3$) gas, and chlorine fluoride ($ClF_3$) gas may be used as the cleaning gas. At least one of HF gas, $F_2$ gas, and $NF_3$ gas may be used as the cleaning gas. Examples of the inert gas may include rare gases such as Ar gas, He gas, Ne gas, Xe gas, and the like, in addition to $N_2$ gas.

(Performing Predetermined Number of Times)

When one cycle including above-described Steps 1b and 2b is repeatedly performed, the deposits on the members in the process chamber 201 can be removed nearly completely. The number of repetition of the above cycle may be, for example, from 20 to 50. As such, it is preferable to repeat the cycle multiple times until the deposits in the members in the process chamber 201 are nearly completely removed.

Thus, the overall etching rate is improved by the combination of Steps 1b and 2b to achieve reduced cleaning time and efficient cleaning. In addition, the deposits formed in the process chamber 201 can be more reliably removed to improve in-plane uniformity of thickness and quality of the SiO film formed on the wafer 200. In addition, an unduly overetching can be suppressed to alleviate damage to the members.

In this embodiment, after the pressure in the process chamber 201 reaches a first pressure included in one pressure range, the first pressure is changed to a second pressure included in the other pressure range without being maintained at the first pressure. In the case where the pressure in the process chamber 201 is maintained at a constant pressure, since the gas is less likely to turn around into the out-of-wafer arrangement region during this period of time, etching efficiency of the deposits in this region cannot be improved. In this case, as a cleaning time is extended as much as the internal pressure is maintained, down-time of the substrate processing apparatus is delayed. Accordingly, by shortening time unnecessary to maintain the internal pressure, the number of repetitions of Steps 1b and 2b can be extended in a shorter time, thereby achieving higher cleaning efficiency.

In addition, in this embodiment, although the pressure rising time period until the pressure in the process chamber 201 reaches the second pressure from the first pressure may be set to be equal to the pressure falling time period until the pressure in the process chamber 201 reaches the first pressure from the second pressure, it is preferable to set the pressure falling time period to be longer, whereas setting the pressure rising time period to be shorter, as shown in FIG. 8. In this manner, by making the cleaning time in the out-of-wafer arrangement region, where deposits are hard to be removed, longer than that in the near-wafer region.

(Stop of HF Gas Supply)

After the deposits on the members in the process chamber 201 are removed, the valve 243d of the fourth gas supply pipe 232d is closed to stop the supply of the HF gas. If the HF gas has been supplied into the process chamber 201 via the first gas supply pipe 232a and the first nozzle 249a, the first gas supply pipe 232a and the first nozzle 249a are closed to stop the supply of the HF gas.

(Purge and Return to Atmospheric Pressure)

After stopping the supply of HF gas, the valves 243h, 243i, 243j, and 243k are opened and $N_2$ gas as inert gases is supplied from the individual first inert gas supply pipe 232h, second inert gas supply pipe 232i, third inert gas supply pipe 232j, and fourth inert gas supply pipe 232k into the process chamber 201, and is exhausted through the exhaust pipe 231 such that the interior of the process chamber 201 is purged by the inert gases (gas purge), thereby removing gas and reaction byproducts remaining in the process chamber 201 from the process chamber 201 (purge). Thereafter, the internal atmosphere of the process chamber 201 is substituted with the inert gas (inert gas substitution) and the pressure in the process chamber 201 returns to the atmospheric pressure (return to atmospheric pressure).
(Boat Unload)

The seal cap 219 is then lowered by the boat elevator 115 to open the bottom of the manifold 209 and the empty boat 217 is unloaded to the outside of the reaction tube 203 through the lower end portion of the manifold 209 (boat unload).

(4) Certain Advantages

This embodiment provides one or more advantages as follows.

According to the cleaning sequence of this embodiment, in Step 2b, when the pressure in the process chamber 201 is changed from the higher second pressure to the lower first pressure, the HF gas and the $N_2$ gas turn around into the narrow gaps and the like in the out-of-wafer arrangement region, thereby improving etching efficiency of the deposits on the members in the out-of-wafer arrangement region, which can lead to more reliable removal of the deposits.

In addition, according to the cleaning sequence of this embodiment, in Step 1b, when the pressure in the process chamber 201 is quickly raised from the lower first pressure to the higher second pressure, the state of the interior of the process chamber 201 can transition to the state where Step 2b can be performed. Accordingly, the cleaning can be efficiently performed.

In addition, according to the cleaning sequence of this embodiment, in Step 1b, even while the pressure in the process chamber 201 is changed from the lower first pressure to the higher second pressure, at least deposits on the member in the near-wafer region can be removed. Accordingly, in Step 1b, since the pressure in the process chamber 201 is raised while continuing to remove deposits on some members as similar to the previous step of Step 2b, the cleaning can be even more efficiently performed.

In addition, according to the cleaning sequence of this embodiment, by removing the deposits by the thermochemical reaction under a non-plasma atmosphere, it is possible to remove the deposits while reducing damage to the members in the process chamber 201.

In addition, according to the cleaning sequence of this embodiment, when the temperature in the process chamber 201 is set to fall within the range from room temperature to 200 degrees C., specifically, for example, from room temperature to 150 degrees C., more specifically, for example, from room temperature to 100 degrees C., water can be extracted from the deposits while preventing the deposits from being peeled off and separated. Accordingly, thermochemical reaction can be caused to remove the deposits while preventing particles.

In addition, according to the cleaning sequence of this embodiment, when the fourth nozzle 249d for supplying the HF gas into the process chamber 201 is configured as a short nozzle, a path of the HF gas in the nozzle can be shortened, thereby alleviating damage to the fourth nozzle 249d due to the HF gas, which can result in long life of the nozzle.

In addition, according to the cleaning sequence of this embodiment, when the first nozzle 249a for supplying the HCDS gas is used to supply the HF gas into the process chamber 201, a silicon-containing layer formed in the first nozzle 249a can be removed.

In addition, according to the cleaning sequence of this embodiment, when the HF gas is supplied into the process chamber 201 without using the second nozzle 249b and the third nozzle 249c, the second nozzle 249b and the third nozzle 249c can be prevented from being damaged due to the HF gas, which can result in long life of these nozzles. In addition, as shown in FIG. 1, the substrate processing apparatus is also configured to supply the HF gas from the second nozzle 249b and the third nozzle 249c. This configuration allows for a degree of freedom of an apparatus operation when gas species are added or replaced.

In this embodiment, the SiO film is formed using the $H_2O$ gas at a low temperature of not higher than 100 degrees C. Accordingly, thick deposits including water may be formed on members (particularly, in the out-of-wafer arrangement region), which may act as a particle source and may be likely to deteriorate characteristics of the SiO film formed on the wafer 200. According to the cleaning sequence of this embodiment, it is possible to more reliably remove these deposits, prevent the particles, and improve the characteristics of the SiO film formed on the wafer 200.

Second Embodiment

Hereinafter, a second embodiment of the present disclosure will be described.

Although it is described in the above first embodiment that a precursor gas, an oxidation agent, and a catalyst are used to form a thin film at a substrate temperature set to not be higher than 200 degrees C., for example, not higher than 100 degrees C., an example of forming a thin film using a precursor gas and a plasma-excited oxidation agent without using any catalyst will be described in the second embodiment.

Figure 10:
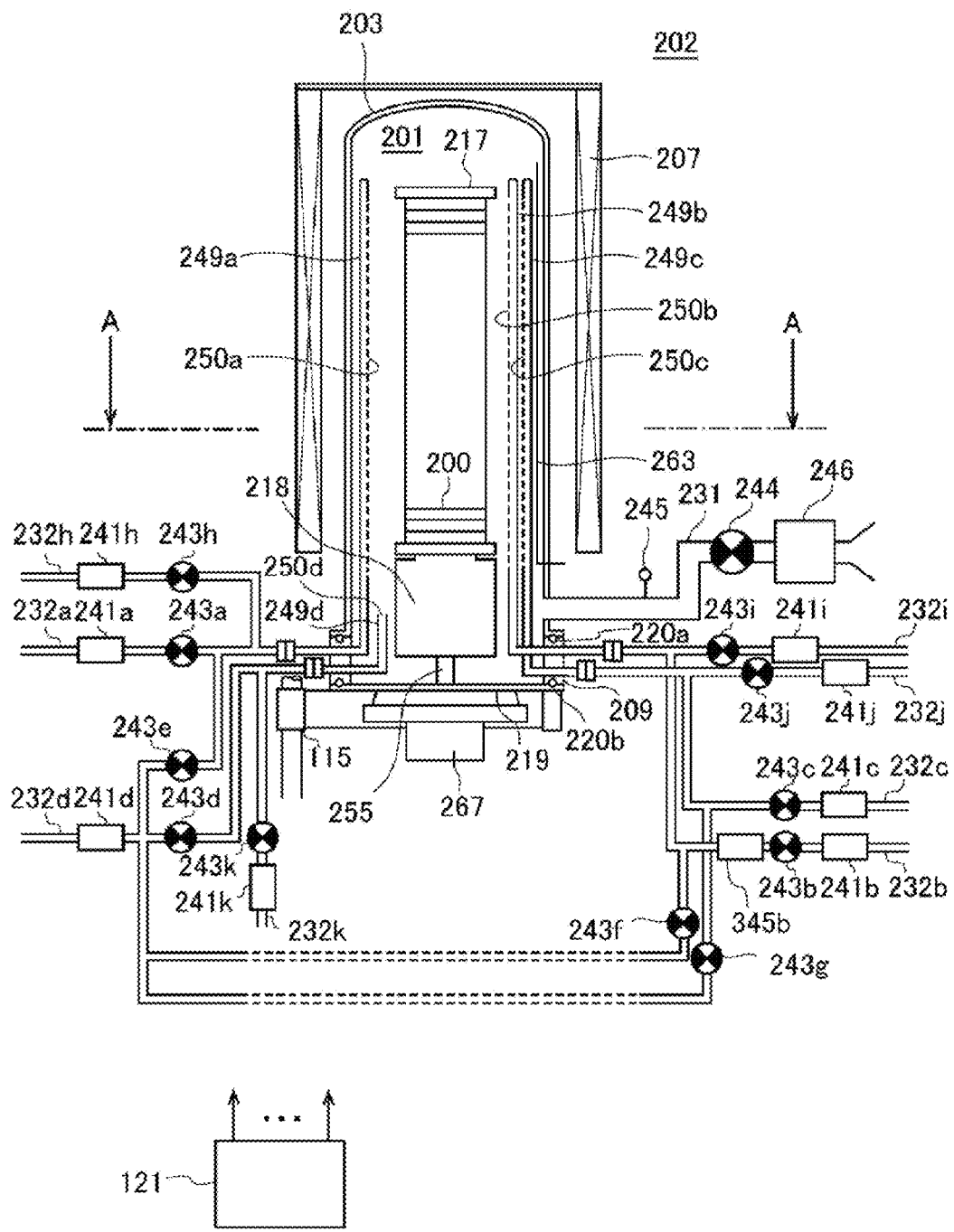
FIG. 10 schematically illustrates a configuration of a vertical process furnace of a substrate processing apparatus, in which a portion of the process furnace is shown by a longitudinal sectional view, according to a second embodiment of the present disclosure.

In this example, for forming a thin film in one step of the process of manufacturing a semiconductor device, the substrate processing apparatus may further include a remote plasma unit 345b serving as an activation mechanism (excitation unit) for activating (exciting) an oxidation agent with plasma, as shown in FIG. 10. The substrate processing apparatus of the second embodiment has substantially the same configurations as those of the first embodiment except the remote plasma unit 345b. For example, the remote plasma unit 345b is interposed between the valve 243b of the second gas supply pipe 232b and a position where the fourth gas supply pipe 232d is connected with the second gas supply pipe 232b. In FIG. 10, the same or similar elements as FIG. 1 are denoted by the same reference numerals and explanation of which will not be repeated.

A film forming sequence of this embodiment includes a process of alternately performing a step of supplying a precursor gas to a substrate and a step of supplying a plasma-excited oxidation agent to the substrate predetermined times.

In forming a thin film using this film forming sequence, even when the temperature of the substrate is not higher than 100 degrees C., the oxidation agent can be activated to provide high reactivity by using plasma instead of a catalyst. Even in this case, similar to the first embodiment, the temperature of the wafer 200 can be set to a temperature within a range from room temperature to 200 degrees C., specifically, for example, from room temperature to 150 degrees C., more specifically, for example, from room temperature to 100 degrees C.

Even in forming a thin film using this film forming sequence, deposits including a thin film are formed in members of the process chamber. Then, the same cleaning process as the first embodiment can be used to more reliably remove the deposits, thereby improving in-plane uniformity of thickness and quality of the thin film formed on the substrate.

Other Embodiments of the Present Disclosure

Although the specific embodiments of the present disclosure are described in detail above, the present disclosure is not limited thereto but may be changed in different ways without departing from the spirit and scope of the present disclosure.

For example, although it is illustrated in the above embodiments that, when the first pressure range is assumed as a lower pressure range and the second pressure range is assumed as a higher pressure range, each step is started from the lower first pressure range, each step may be started from the higher second pressure range.

In addition, although it is illustrated in the above embodiments that the pressure rising time in Step 1b is set to be shorter and the pressure falling time period in Step 2b is set to be longer as shown in FIG. 8, time periods of Steps 1b and 2b may be appropriately changed. In addition, a gradient of a pressure change in Steps 1b and 2b may be changed in different ways by adjusting the time periods in Steps 1b and 2b or adjusting a difference between the first pressure and the second pressure. In addition, although it is shown in FIG. 8 that a pressure is linearly changed, the pressure may be nonlinearly changed.

In addition, it is illustrated in the above embodiments that the pressure in the process chamber 201 is changed between the same first pressure and the same second pressure each time, while Steps 1b and 2b are repeated. However, the pressure in the process chamber 201 may be changed to different pressures within each pressure range each time, every several times, or irregularly.

In addition, although it is illustrated in the above embodiments that the lower portion of the boat 217, the inner wall of the manifold 209 and the like are positioned outside a region surrounded by the heater 207 as shown in FIG. 1, a heating mechanism for heating these members may be separately installed, for example, near a furnace opening or the like. For one or both of the film forming process and the cleaning process, this heating mechanism may be used to heat the out-of-wafer arrangement region to 90 to 100 degrees C. or the like for the film forming process, and 100 degrees C. or the like for the cleaning process. This may result in reduced amount (thickness) of deposits in the film forming process and a further increased etching rate of deposits in the cleaning process, thereby providing more increased effects of the present disclosure.

In addition, although an example of using the chlorosilane-based precursor as a precursor to form the SiO film is illustrated in the above embodiments, the chlorosilane-based precursor may be replaced with other silane-based precursors having halogen-based ligands. For example, the chlorosilane-based precursor may be replaced with a fluorosilane-based precursor. Here, the fluorosilane-based precursor refers to a silane-based precursor which has a fluoro group as a halogen group and contains at least a silicon (Si) element and a fluorine (F) element. Examples of fluorosilane-based precursor gas may include silicon fluoride gases such as a tetrafluorosilane (e.g., silicon tetrafluoride ($SiF_4$)) gas, a hexafluorosilane ($Si_2F_6$) gas, and the like. In this case, the oxidation gas and the catalyst gas may be the same as those in the above embodiments. In addition, the same process conditions as in the above embodiments may be used.

Further, although it is illustrated in the above embodiments that various heterocyclic compounds having kPa of 5 to 7 or the like, including pyridine, are employed as a catalyst used to form the SiO film, ammonia ($NH_3$, kPa=9.2) gas, trimethylamine ($N(CH_3)_3$, pKa=9.8) gas, methylamine ($H_2N(CH_3)$, pKa=10.6) gas, a triethylamine ($N(C_2H_5)_3$, pKa=10.7) gas, and the like, which are relatively high but not larger than 11 in terms of pKa, may be used as a catalyst.

Furthermore, although the example of forming the film using the batch type substrate processing apparatus to process a plurality of substrates at once is described in the above embodiments, the present disclosure is not limited thereto but may be suitably applied to film formation using a single type substrate processing apparatus to process a single substrate or several substrates at once.

In addition, the above embodiments, their modifications, and their applications may be used in proper combinations.

In addition, the present disclosure may be implemented by changing process recipes or cleaning recipes in an existing substrate processing apparatus. Changing the process recipes or the cleaning recipes may be implemented by installing process recipes or cleaning recipes of the present disclosure into the existing substrate processing apparatus via a telecommunication line or a recording medium storing the process recipes or cleaning recipes of the present disclosure, or operating the input/output device in the existing substrate processing apparatus to change its existing process recipes or cleaning recipes into the process recipes and cleaning recipes of the present disclosure.

EXAMPLES

As an example of the present disclosure, the substrate processing apparatus of the above embodiment is simulated to clean the interior of the process chamber according to the cleaning sequence of the above embodiments by supplying HF gas into the process chamber in which the process of forming a SiO film on a wafer has been performed. In this case, the pressure in the process chamber is alternately changed between 133 Pa and 6,650 Pa. Then, a cleaning rate (deposit etching rate) at each portion of a heat insulating member at the bottom portion of the boat is measured. In addition, as an comparative example, the substrate processing apparatus of the above embodiment is simulated to clean the interior of the process chamber by supplying HF gas into the process chamber in which the process of forming a SiO film on a wafer has been performed. In this case, the pressure in the process chamber is constantly maintained at 13,300 Pa (100 Torr). Then, a cleaning rate at each portion of a heat insulating member at the bottom portion of the boat is measured.

In both of the example of the present disclosure and the comparative example, the temperature in the process chamber is set to 100 degrees C. and supply of the HF gas into the process chamber is performed via a long nozzle used for supplying HCDS gas. The cleaning rate is calculated by measuring thickness before and after cleaning of deposits formed on sample pieces adhered to various portions of the heat insulating member.

Figure 11:
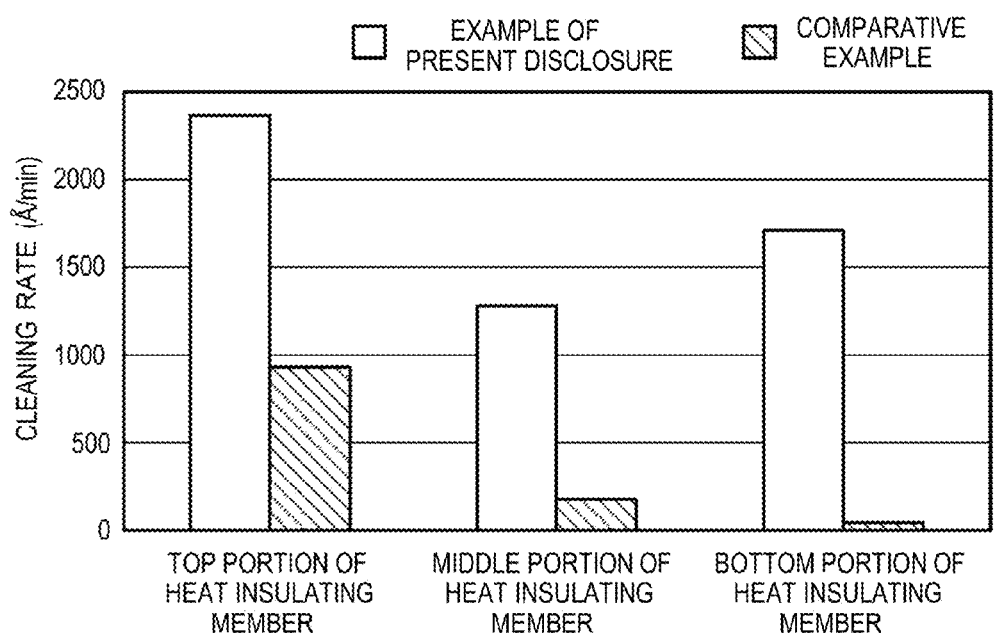
FIG. 11 shows a graph illustrating cleaning rates in an example of the present disclosure and a comparative example.

FIG. 11 shows a graph illustrating cleaning rates in an example of the present disclosure and a comparative example. In the graph, a vertical axis represents a cleaning rate (A/min) and a horizontal axis represents top, middle, and bottom portions of the heat insulating member. In the graph, white bars represent results of the measurement in the example of the present disclosure, while hatched bars represent results of the measurement in the comparative example. As can be seen from FIG. 11, the example of the present disclosure provides a significantly increased cleaning rate and a reduced difference in cleaning rate between the portions of the heat insulating member, as compared to the comparative example. As such, the cleaning rate is apparently increased in an out-of-wafer arrangement region by changing the internal pressure of the process chamber according to the cleaning sequence of the above-described embodiments, instead of constantly maintaining the internal pressure.

Figure 12:
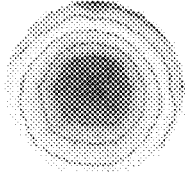
FIG. 12 shows film forming characteristics of an oxide film formed in a process chamber before and after the cleaning according to examples of the present disclosure is performed.
Figure 12:
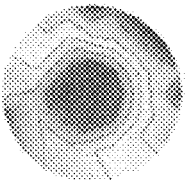
Figure 12:
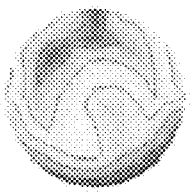
Figure 12:
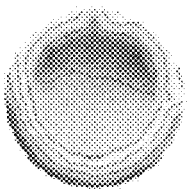
Figure 12:
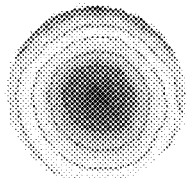
Figure 12:
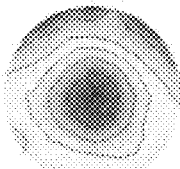

FIG. 12 shows film forming characteristics of an oxide film formed in a process chamber before and after a cleaning process in the example of the present disclosure. This illustrates average in-plane film thickness and in-plane uniformity of film thickness in SiO films formed on wafers which are accommodated in the top, middle, and bottom portions of the boat before and after a cleaning process is performed. The in-plane uniformity may be obtained using a maximum film thickness and a minimum film thickness within the plane of the wafer according to following Equation 1. As such, the in-plane uniformity represents a variation in film thickness within the plane of the wafer and means that its smaller value provides a smaller variation in film thickness.

In-plane Uniformity=[(Maximum Film Thickness–Minimum Film Thickness)/(Average Film Thickness×2)]×100(±%)   [Equation 1]

It can be seen from FIG. 12 that an effect of improvement of the in-plane uniformity by the cleaning process is significant in the bottom portion of the boat that may be subjected to deposits, which may include a large amount of water and are formed on surfaces of the manifold, the heat insulating member, and so on. It is believed that this is because the deposits acting as a water source are removed by the cleaning process. In addition, the same effect of improving the in-plane uniformity by the cleaning process is achieved even in the top portion of the boat near the top portion of the reaction tube which has poor purge efficiency and is not covered by a heater. In this manner, it can be seen that the characteristics of the SiO film formed on the wafer are improved by cleaning the interior of the process chamber according to the cleaning sequence of the above-described embodiments.

In addition, a cleaning rate at each portion of the boat and the heat insulating member in the case of supplying HF gas using a short nozzle instead of a long nozzle in the above example is measured.

Figure 13:
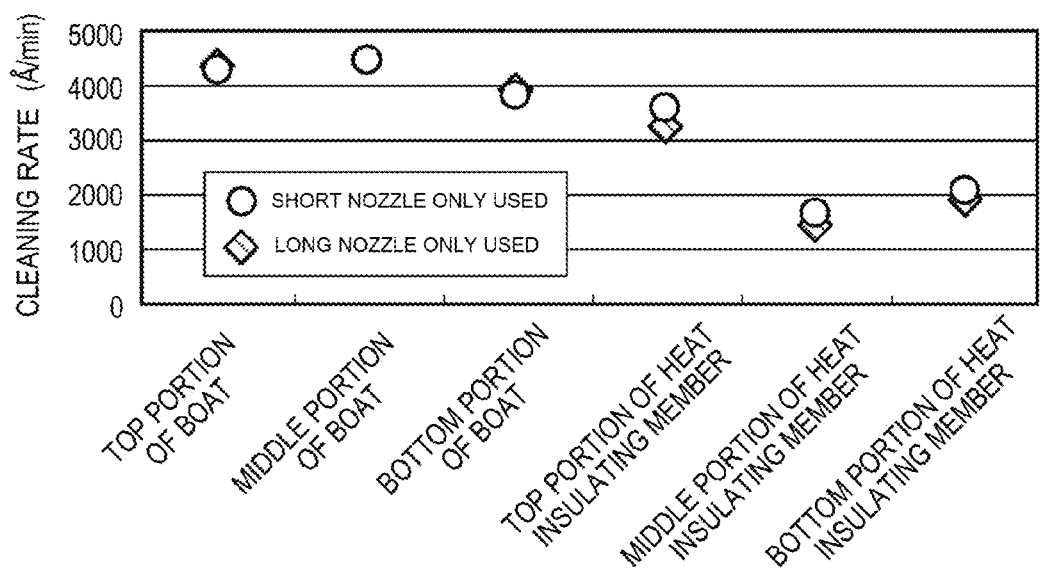
FIG. 13 shows a graph illustrating cleaning rates in the cases of employing a short nozzle and a long nozzle, according to examples of the present disclosure.

FIG. 13 shows a graph of cleaning rates in the cases of employing a short nozzle and a long nozzle according to an example of the present disclosure. In the graph, a horizontal axis represents top, middle, and bottom portions of the boat and the heat insulating member, while a vertical axis represents a cleaning rate (Å/min) in each portion. In the graph, circle marks indicate measurement results when a short nozzle is used and hatched diamond mark represent measurement results when a long nozzle is used. As illustrated in FIG. 13, the case of using the short nozzle provides substantially the same cleaning rate as the case of using the long nozzle at the portions of the boat in the wafer arrangement region. In addition, since the short nozzle has a gas supply hole near the lower portion of the boat, the cleaning rates in the portions of the heat insulating member, which is located below the boat, are slightly increased. Accordingly, it can be understood that the short nozzle provides substantially the same good cleaning effects as the long nozzle.

Further Additional Aspects of Present Disclosure

Hereinafter, some aspects of the present disclosure will be additionally described.

An aspect of the present disclosure provides a method of cleaning an interior of a process chamber by supplying a cleaning gas into the process chamber after a process of forming a thin film on a substrate in the process chamber is performed, the method including alternately repeating, in a state where supplying the cleaning gas into the process chamber is maintained, changing a pressure in the process chamber from a first pressure range to a second pressure range, and changing the pressure in the process chamber from the second pressure range to the first pressure range, wherein in the act of alternately repeating the acts of changing the pressure in the process chamber, when the pressure in the process chamber is changed to the first pressure range after being changed to the second pressure range, the pressure in the process chamber is changed to the first pressure range without being maintained at the second pressure range, and when the pressure in the process chamber is changed to the second pressure range after being changed to the first pressure range, the pressure in the process chamber is changed to the second pressure range without being maintained at the first pressure range.

In some embodiments, the act of alternately repeating the acts of changing the pressure in the process chamber is performed under a non-plasma atmosphere.

In some embodiments, in the act of alternately repeating the acts of changing the pressure in the process chamber, deposits including the thin film deposited on a surface of a member in the process chamber are removed by a thermochemical reaction.

In some embodiments, the first pressure range is from 13 to 2,660 Pa and the second pressure range is from 5,320 to 13,300 Pa.

In some embodiments, in the act of alternately repeating the acts of changing the pressure in the process chamber, a temperature in the process chamber is set to be not lower than room temperature and not higher than 200 degrees C.

In some embodiments, in the act of alternately repeating the acts of changing the pressure in the process chamber, a temperature in the process chamber is set to be not lower than room temperature and not higher than 150 degrees C.

In some embodiments, in the act of alternately repeating the acts of changing the pressure in the process chamber, a temperature in the process chamber is set to be not lower than room temperature and not higher than 100 degrees C.

In some embodiments, the thin film is an oxide film.

In some embodiments, the thin film is an oxide film which is formed under a condition where a temperature of the substrate set to be not higher than 100 degrees C.

In some embodiments, the thin film is an oxide film which is formed under a condition where a temperature of the substrate is set to be not lower than room temperature and not higher than 100 degrees C.

In some embodiments, the thin film is an oxide film which is formed using a precursor gas, an oxidation agent, and a catalyst.

In some embodiments, the thin film is an oxide film which is formed by performing a predetermined number of times a cycle including supplying a precursor gas to the substrate, supplying an oxidation agent to the substrate, and supplying a catalyst to the substrate.

In some embodiments, the thin film is an oxide film which is formed by alternately performing a predetermined number of times supplying a precursor gas and a catalyst to the substrate and supplying an oxidation agent and a catalyst to the substrate.

In some embodiments, the thin film is an oxide film which is formed using a precursor gas and a plasma-excited oxidation agent.

In some embodiments, the thin film is an oxide film which is formed by alternately performing a predetermined number of times supplying a precursor gas to the substrate and supplying a plasma-excited oxidation agent to the substrate.

In some embodiments, the cleaning gas includes a fluorine-based gas.

In some embodiments, the cleaning gas includes at least one selected from a group consisting of hydrogen fluoride (HF) gas, fluorine ($F_2$) gas, nitrogen fluoride ($NF_3$) gas, and chlorine fluoride ($ClF_3$) gas In some embodiments, the cleaning gas includes a hydrogen fluoride (HF) gas.

Another aspect of the present disclosure provides a method of manufacturing a semiconductor device, the method including performing a process of forming a thin film on a substrate in a process chamber; and cleaning an interior of the process chamber by supplying a cleaning gas to the process chamber after the process of forming the thin film is performed, wherein the act of cleaning the interior of the process chamber includes alternately repeating, in a state where supplying the cleaning gas into the process chamber is maintained, changing a pressure in the process chamber from a first pressure range to a second pressure range, and changing the pressure in the process chamber from the second pressure range to the first pressure range, and wherein in the act of alternately repeating the acts of changing the pressure in the process chamber, when the pressure in the process chamber is changed to the first pressure range after being changed to the second pressure range, the pressure in the process chamber is changed to the first pressure range without being maintained at the second pressure range, and when the pressure in the process chamber is changed to the second pressure range after being changed to the first pressure range, the pressure in the process chamber is changed to the second pressure range without being maintained at the first pressure range Still another aspect of the present disclosure provides a substrate processing apparatus including a process chamber in which a process of forming a thin film on a substrate is performed; a cleaning gas supply system configured to supply a cleaning gas into the process chamber; a pressure adjuster configured to adjust a pressure in the process chamber; and a controller configured to control the cleaning gas supply system and the pressure adjuster such that when an interior of the process chamber is cleaned by supplying the cleaning gas into the process chamber after the process of forming the thin film on the substrate in the process chamber is performed, changing the pressure in the process chamber from a first pressure range to a second pressure range and changing the pressure in the process chamber from the second pressure range to the first pressure range are alternately repeated in a state where supplying of the cleaning gas into the process chamber is maintained, wherein in the act of alternately repeating the acts of changing the pressure in the process chamber, when the pressure in the process chamber is changed to the first pressure range after being changed to the second pressure range, the pressure in the process chamber is changed to the first pressure range without being maintained at the second pressure range, and when the pressure in the process chamber is changed to the second pressure range after being changed to the first pressure range, the pressure in the process chamber is changed to the second pressure range without being maintained at the first pressure range.

Yet another aspect of the present disclosure provides a program that causes a computer to perform a process of cleaning an interior of a process chamber by supplying a cleaning gas into the process chamber after a process of forming a thin film on a substrate in the process chamber is performed, the process of cleaning the interior of the process chamber including alternately repeating, in a state where supplying the cleaning gas into the process chamber is maintained, changing a pressure in the process chamber from a first pressure range to a second pressure range, and changing the pressure in the process chamber from the second pressure range to the first pressure range, wherein in the act of alternately repeating the acts of changing the pressure in the process chamber, when the pressure in the process chamber is changed to the first pressure range after being changed to the second pressure range, the pressure in the process chamber is changed to the first pressure range without being maintained at the second pressure range, and when the pressure in the process chamber is changed to the second pressure range after being changed to the first pressure range, the pressure in the process chamber is changed to the second pressure range without being maintained at the first pressure range.

Yet another aspect of the present disclosure provides a non-transitory computer-readable recording medium storing a program that causes a computer to perform a process of cleaning an interior of a process chamber by supplying a cleaning gas into the process chamber after a process of forming a thin film on a substrate in the process chamber is performed, the process of cleaning the interior of the process chamber including alternately repeating, in a state where supplying the cleaning gas into the process chamber is maintained, changing a pressure in the process chamber from a first pressure range to a second pressure range, and changing the pressure in the process chamber from the second pressure range to the first pressure range, wherein in the act of alternately repeating the acts of changing the pressure in the process chamber, when the pressure in the process chamber is changed to the first pressure range after being changed to the second pressure range, the pressure in the process chamber is changed to the first pressure range without being maintained at the second pressure range, and when the pressure in the process chamber is changed to the second pressure range after being changed to the first pressure range, the pressure in the process chamber is changed to the second pressure range without being maintained at the first pressure range.

According to the present disclosure in some embodiments, it is possible to provide a method of cleaning, a method of manufacturing a semiconductor device, a substrate processing apparatus, and a non-transitory computer-readable recording medium, which are capable of more reliably removing deposits formed in a process chamber, thereby improving uniformity of thickness and in-plane quality of a thin film formed on a substrate.

While certain embodiments have been described, these embodiments have been presented by way of example only, and are not intended to limit the scope of the disclosure. Indeed, the novel methods and apparatuses described herein may be embodied in a variety of other forms; furthermore, various omissions, combinations, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of cleaning an interior of a process chamber by supplying a cleaning gas into the process chamber after a process of forming a thin film on a substrate in the process chamber is performed, the method comprising:

alternately repeating, in a state where supplying the cleaning gas into the process chamber is maintained, changing a pressure in the process chamber from a first pressure range to a second pressure range, and changing the pressure in the process chamber from the second pressure range to the first pressure range, wherein in the act of alternately repeating the acts of changing the pressure in the process chamber, when the pressure in the process chamber is changed to the first pressure range after being changed to the second pressure range, the pressure in the process chamber is changed to the first pressure range without being maintained at the second pressure range, and when the pressure in the process chamber is changed to the second pressure range after being changed to the first pressure range, the pressure in the process chamber is changed to the second pressure range without being maintained at the first pressure range, wherein a low pressure range is a lower one of the first pressure range and the second pressure range and a high pressure range is a higher one of the first pressure range and the second pressure range, and wherein in the act of alternately repeating the acts of changing the pressure in the process chamber, a pressure falling time period which occurs until the pressure in the process chamber reaches the low pressure range from the high pressure range is set to be longer than a pressure rising time period which occurs until the pressure in the process chamber reaches the high pressure range from the low pressure range.

2. The method according to claim 1, wherein the act of alternately repeating the acts of changing the pressure in the process chamber is performed under a non-plasma atmosphere.

3. The method according to claim 1, wherein in the act of alternately repeating the acts of changing the pressure in the process chamber, deposits including the thin film deposited on a surface of a member in the process chamber are removed by a thermochemical reaction.

4. The method according to claim 1, wherein the first pressure range is from 13 to 2,660 Pa and the second pressure range is from 5,320 to 13,300 Pa.

5. The method according to claim 1, wherein in the act of alternately repeating the acts of changing the pressure in the process chamber, a temperature in the process chamber is set to be not lower than room temperature and not higher than 200 degrees C.

6. The method according to claim 1, wherein the cleaning gas includes a fluorine-based gas.

7. The method according to claim 1, wherein the cleaning gas includes at least one selected from a group consisting of hydrogen fluoride gas, fluorine gas, nitrogen fluoride gas, and chlorine fluoride gas.

8. The method according to claim 1, wherein the cleaning gas includes a hydrogen fluoride gas.

* * * * *